(12) United States Patent
Zhao et al.

(10) Patent No.: US 7,550,845 B2
(45) Date of Patent: Jun. 23, 2009

(54) BALL GRID ARRAY PACKAGE WITH SEPARATED STIFFENER LAYER

(75) Inventors: Sam Ziqun Zhao, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 942 days.

(21) Appl. No.: 10/284,366

(22) Filed: Oct. 31, 2002

(65) Prior Publication Data

US 2003/0146509 A1     Aug. 7, 2003

Related U.S. Application Data

(60) Provisional application No. 60/352,877, filed on Feb. 1, 2002.

(51) Int. Cl.
*H01L 23/48* (2006.01)
(52) U.S. Cl. .......... 257/738; 257/701; 257/702; 257/737; 257/669; 257/747; 257/717; 257/780; 257/E23.004; 257/E23.026; 257/E23.051
(58) Field of Classification Search ........... 257/738, 257/701, 702, 737, 669, 747, 717, 780, E23.004, 257/E23.006, E23.051
See application file for complete search history.

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,153,379 A | 10/1992 | Guzuk et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |

(Continued)

FOREIGN PATENT DOCUMENTS

DE      42 13 251 A1    10/1992

(Continued)

OTHER PUBLICATIONS

U.S. Appl. No. 10/284,312, filed Oct. 31, 2002, Zhao et al.

(Continued)

*Primary Examiner*—Lynne Gurley
*Assistant Examiner*—Junghwa Im
(74) *Attorney, Agent, or Firm*—Sterne, Kessler, Goldstein & Fox, PLLC.

(57) ABSTRACT

In a ball grid array (BGA) package, a first stiffener is attached to a surface of a substrate. A second stiffener is attached to the surface of the substrate to be co-planar with the first stiffener. The second stiffener is separated from the first stiffener by a channel therebetween. An integrated circuit (IC) die is mounted to a surface of the second stiffener.

22 Claims, 15 Drawing Sheets

U.S. PATENT DOCUMENTS

| | | |
|---|---|---|
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,543,662 A | 8/1996 | Burward-Hoy |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,668,406 A | 9/1997 | Egawa |
| 5,691,567 A | 11/1997 | Lo et al. |
| 5,717,252 A * | 2/1998 | Nakashima et al. ......... 257/707 |
| 5,732,465 A | 3/1998 | Tokita et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A * | 3/1999 | Culnane et al. ............. 257/701 |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A * | 11/1999 | Suzuki et al. ................ 257/738 |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A * | 3/2000 | Lan et al. .................... 257/698 |
| 6,040,984 A | 3/2000 | Hirakawa |
| 6,057,601 A | 5/2000 | Lau et al. |
| 6,060,777 A | 5/2000 | Jamieson et al. |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,092,281 A | 7/2000 | Glenn et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,145,365 A | 11/2000 | Miyahara et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,229,702 B1 | 5/2001 | Tao et al. |
| 6,242,279 B1 | 6/2001 | Ho et al. |
| 6,246,111 B1 * | 6/2001 | Huang et al. ................ 257/675 |
| 6,278,613 B1 | 8/2001 | Fernandez et al. |
| 6,288,444 B1 * | 9/2001 | Abe et al. .................... 257/712 |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,380,623 B1 | 4/2002 | Demore |
| 6,432,742 B1 | 8/2002 | Guan et al. |
| 6,462,274 B1 | 10/2002 | Shim et al. |
| 6,472,741 B1 * | 10/2002 | Chen et al. .................. 257/712 |
| 6,515,361 B2 | 2/2003 | Lee et al. |
| 6,525,942 B2 * | 2/2003 | Huang et al. ................ 361/704 |
| 6,528,869 B1 | 3/2003 | Glenn et al. |
| 6,528,892 B2 | 3/2003 | Caletka et al. |
| 6,537,848 B2 | 3/2003 | Camenforte et al. |
| 6,541,832 B2 * | 4/2003 | Coyle ......................... 257/415 |
| 6,545,351 B1 | 4/2003 | Jamieson et al. |
| 6,551,918 B2 | 4/2003 | Yuzawa et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,559,525 B2 | 5/2003 | Huang |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,624,523 B2 | 9/2003 | Chao et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,737,750 B1 | 5/2004 | Hoffman et al. |
| 6,775,140 B2 | 8/2004 | Shim et al. |
| 6,838,761 B2 | 1/2005 | Karnezos |
| 6,853,070 B2 | 2/2005 | Khan et al. |
| 6,867,493 B2 | 3/2005 | Hashemi et al. |
| 6,879,039 B2 | 4/2005 | Khan et al. |
| 6,882,042 B2 | 4/2005 | Zhao et al. |
| 7,015,072 B2 | 3/2006 | Combs et al. |
| 7,026,711 B2 | 4/2006 | Lee et al. |
| 7,057,277 B2 | 6/2006 | Chen et al. |
| 7,061,102 B2 | 6/2006 | Eghan et al. |
| 7,132,744 B2 | 11/2006 | Zhao et al. |
| 7,148,084 B2 | 12/2006 | Stobel et al. |
| 7,161,239 B2 | 1/2007 | Zhao et al. |
| 7,259,448 B2 | 8/2007 | Zhang et al. |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096750 A1 | 7/2002 | Suzuki |
| 2002/0096767 A1 | 7/2002 | Cote et al. |
| 2002/0098617 A1 | 7/2002 | Lee et al. |

| | | | |
|---|---|---|---|
| 2002/0109226 | A1 | 8/2002 | Khan et al. |
| 2002/0135065 | A1 | 9/2002 | Zhao et al. |
| 2002/0171144 | A1 | 11/2002 | Zhang et al. |
| 2002/0180040 | A1 | 12/2002 | Camenforte et al. |
| 2002/0185717 | A1 | 12/2002 | Eghan et al. |
| 2003/0111726 | A1 | 6/2003 | Khan et al. |
| 2003/0138613 | A1* | 7/2003 | Thoman |
| 2004/0072456 | A1 | 4/2004 | Dozier, II et al. |
| 2004/0113284 | A1 | 6/2004 | Zhao et al. |
| 2005/0280127 | A1 | 12/2005 | Zhao et al. |
| 2005/0280139 | A1 | 12/2005 | Zhao et al. |
| 2006/0065972 | A1 | 3/2006 | Khan et al. |
| 2007/0007644 | A1 | 1/2007 | Zhao et al. |
| 2007/0200210 | A1 | 8/2007 | Zhao et al. |

FOREIGN PATENT DOCUMENTS

| | | |
|---|---|---|
| DE | 100 56 281 | 5/2002 |
| EP | 0 573 297 A2 | 12/1993 |
| EP | 0 504 411 B1 | 6/1998 |
| FR | 2 803 098 A3 | 6/2001 |
| JP | 61-49446 | 3/1986 |
| JP | 7-283336 | 10/1995 |
| JP | 10-50877 | 2/1998 |
| JP | 10-189835 | 7/1998 |
| JP | 10-247702 | 9/1998 |
| JP | 10-247703 | 9/1998 |
| JP | 11-17064 | 1/1999 |
| JP | 11-102989 | 4/1999 |
| JP | 2000-286294 | 10/2000 |
| JP | 2001-68512 | 3/2001 |
| TW | 383908 | 3/2000 |
| TW | 417219 | 1/2001 |

OTHER PUBLICATIONS

U.S. Appl. No. 10/284,340, filed Oct. 31, 2002, Zhao et al.
U.S. Appl. No. 10/201,891, filed Jul. 25, 2002, Zhao et al.
U.S. Appl. No. 10/200,336, filed Jul. 23, 2002, Khan et al.
U.S. Appl. No. 10/197,438, filed Jul. 18, 2002, Zhao et al.
U.S. Appl. No. 10/201,309, filed Jul. 24, 2002, Khan et al.
U.S. Appl. No. 10/201,893, filed Jul. 25, 2002, Zhao et al.
U.S. Appl. No. 10/200,255, filed Jul. 23, 2002, Zhao et al.
U.S. Appl. No. 10/101,751, filed Mar. 21, 2002, Zhao et al.
U.S. Appl. No. 10/253,600, filed Sep. 25, 2002, Zhong et al.
U.S. Appl. No. 10/284,371, filed Oct. 31, 2002, Khan et al.
U.S. Appl. No. 10/284,349, filed Oct. 31, 2002, Khan et al.
U.S. Appl. No. 10/284,166, filed Oct. 31, 2002, Zhao et al.
Ahn, S.H. and Kwon, Y.S., "Popcorn Phenomena in a Ball Grid Array Package", IEEE Transactions on Components, Packaging, and Manufacturing Technology Part B: Advanced Packaging, IEEE, Aug. 1995, vol. 18, No. 3, pp. 491-496.
Amkor Electronics, "Amkor BGA Packaging: Taking The World By Storm", Electronic Packaging & Production, Cahners Publishing Company, May 1994, page unknown.
Anderson, L. and Trabucco, B., "Solder Attachment Analysis of Plastic BGA Modules", Surface Mount International Conference, Surface Mount International, Aug. 28-Sep. 1, 1994, San Jose, California, pp. 189-194.
Andrews, M., "Trends in Ball Grid Array Technology," Ball Grid Array National Symposium, Mar. 29-30, 1995, Dallas, Texas, 10 pages.
Attarwala, A.I. Dr. and Stierman , R., "Failure Mode Analysis of a 540 Pin Plastic Ball Grid Array", Surface Mount International Conference, Surface Mount International, Aug. 28-Sep. 1, 1994, San Jose, California, pp. 252-257.
Banerji, K., Development of the Slightly Larger Than IC Carrier (SLICC), Journal of Surface Mount Technology, Jul. 1994, pp. 21-26.
Bauer, C., Ph. D., "Partitioning and Die Selection Strategies for Cost Effective MCM Designs", Journal of Surface Mount Technology, Oct. 1994, pp. 4-9.
Bernier, W.E. et al., "BGA vs. QFP: A Summary of Tradeoffs for Selection of High I/O Components", Surface Mount International Conference Proceedings, Surface Mount International, Aug. 28-Sep. 1, 1994, San Jose, California, pp. 181-185.
Burgos, J. et al., "Achieving Accurate Thermal Characterization Using a CFD Code—A Case Study of Plastic Packages", IEEE Transactions on Components, Packaging, and Manufacturing Technology Part A, IEEE, Dec. 1995, vol. 18, No. 4, pp. 732-738.
Chadima, M., "Interconnecting Structure Manufacturing Technology," Ball Grid Array National Symposium, Dallas, Texas, Mar. 29-30, 1995.
Chanchani, R. et al., "Mini BGA: Pad and Pitch Ease Die Test and Handling", Advanced Packaging, IHS Publishing Group, May/Jun. 1995, pp. 34, 36-37.
Chung, T.C. et al., "Rework of Plastic, Ceramic, and Tape Ball Grid Array Assemblies", Ball Grid Array National Symposium Proceedings, Dallas, Texas, Mar. 29-30, 1995, pp. 1-15.
Cole, M.S. and Caulfield, T. "A Review of Available Ball Grid Array (BGA) Packages", Journal of Surface Mount Technology, Surface Mount Technology Association, Jan. 1996, vol. 9, pp. 4-11.
Cole, M.S. and Caulfield, T., "Ball Grid Array Packaging", Surface Mount International Conference Proceedings, Surface Mount International, Aug. 28-Sep. 1, 1994, San Jose, California, pp. 147-153.
Dobers, M. and Seyffert, M., "Low Cost MCMs: BGAs Provide a Fine-Pitch Alternative", Advanced Packaging, IHS Publishing Group, Sep./Oct. 1994, vol. 3, No. 5, pp. 28, 30 and 32.
Dody, G. and Burnette, T., "BGA Assembly Process and Rework", Journal of Surface Mount Technology, Surface Mount Technology Association, Jan. 1996, vol. 9, pp. 39-45.
Edwards, D. et al., "The Effect of Internal Package Delaminations on the Thermal Performance of PQFP, Thermally Enhanced PQFP, LOC and BGA Packages", 45th Electronic Components & Technology Conference, IEEE, May 21-24, 1995, Las Vegas, NV, pp. 285-292.
Ejim, T.L. et al., "Designed Experiment to Determine Attachment Reliability Drivers for PBGA Packages", Journal of Surface Mount Technology, Surface Mount Technology Association, Jan. 1996, vol. 9, pp. 30-38.
Ewanich, J. et al., "Development of a Tab (TCP) Ball Grid Array Package", Proceedings of the 1995 International Electronics Packaging Conference, San Diego, CA, Sep. 24-27, 1995, pp. 588-594.
Fauser, S. et al, "High Pin-Count PBGA Assembly", Circuits Assembly, Feb. 1995, vol. 6, No. 2, pp. 36-38 and 40.
Fauser, Suzanne et al., "High Pin Count PBGA Assembly: Solder Defect Failure Modes and Root Cause Analysis", Surface Mount International, Proceedings of The Technical Program , Surface Mount International, Aug. 28-Sep. 1, 1994, San Jose, California, pp. 169-174.
Ferguson, M. "Ensuring High-Yield BGA Assembly", Circuits Assembly, Feb. 1995, vol. 6, No. 2, pp. 54, 56 and 58.
Freda, M., "Laminate Technology for IC Packaging", Electronic Packaging & Production, Cahners Publishing Company, Oct. 1995, vol. 35, No. 11, pp. S4-S5.
Freedman, M., "Package Size and Pit-Out Standardization", Ball Grid Array National Symposium, Mar. 29-30, 1995, 7 pages.
Freyman, B. and Pennisi, R., "Over-molded Plastic Pad Arrary Carriers (OMPAC): A Low Cost, High Interconnect Density IC Packaging Solution for Consumer and Industrial Electronics", 41st Electronic Components & Technology Conference, IEEE, May 11-16, 1991, pp. 176-182.
Freyman, B. et al., "Surface Mount Process Technology for Ball Grid Array Packaging", Surface Mount International Conference Proceedings, Surface Mount International, Aug. 29-Sep. 2, 1993, San Jose, California, pp. 81-85.
Freyman, B. et al., "The Move to Perimeter Plastic BGAs", Surface Mount International Conference Proceedings, San Jose, CA, Aug. 29-31, 1995, pp. 373-382.
Freyman, B., "Trends in Plastic BGA Packaging," Ball Grid Array National Symposium, Dallas, Texas, Mar. 29-30, 1995, 45 pages.
Gilleo, K., "Electronic Polymers: Die Attach and Oriented Z-Axis Films", Advanced Packaging, IHS Publishing Group, Sep./Oct. 1994, vol. 3, No. 5, pp. 37-38, 40 and 42.
Guenin, B. et al., "Analysis of a Thermally Enhanced Ball Grid Array Package", IEEE Transactions on Components, Packaging, and Manufacturing Technology, Part A, IEEE Components, Packaging, and Manufacturing Technology Society, Dec. 1995, vol. 18, No. 4, pp. 749-757.

Hart, C., "Vias in Pads for Coarse and Fine Pitch Ball Grid Arrays", Surface Mount International Conference Proceedings, Surface Mount International, Aug. 28-Sep. 1, 1994, San Jose, California, pp. 203-207.

Hart, C. "Vias in Pads", Circuits Assembly, Feb. 1995, vol. 6, No. 2, pp. 42, 44-46 and 50.

Hattas, D., "BGAs Face Production Testing: New Package Offers Promise but Must Clear Technology Hurdles.", Advanced Packaging, IHS Publishing Group, Summer 1993, vol. 2, No. 3, pp. 44-46.

Schueller, R.D. et al., "Performance and Reliability of a Cavity Down Tape BGA Package," *IEEE Electronic Packaging Technology Conference*, 1997, pp. 151-162.

Hodson, T., "Study Examines BGA Use", Electronic Packaging & Production, Mar. 1993, page unknown.

Holden, H., "The Many Techniques of Small Via Formation for Thin Boards", The Institute for Interconnecting and Packaging Electronic Circuits Ball Grid Array National Symposium, San Diego, CA, Jan. 18-19, 1996, pp. 1-7.

Houghten, J., "New Package Takes On QFPs", Advanced Packaging, IHS Publishing Group, Winter 1993, vol. 2, No. 1, pp. 38-39.

"How To Give Your BGAs A Better Bottom Line.", Advanced Packaging, IHS Publishing Group, Jan./Feb. 1995, page unknown.

Huang, W. and Ricks, J., "Electrical Characterization of PBGA for Communication Applications by Simulation and Measurement", National Electronic Packaging and Production Conference West '95, Feb. 26-Mar. 1995, Anaheim, California, pp. 300-307.

Hundt, M. et al., "Thermal Enhancements of Ball Grid Arrays", National Electronic Packaging and Production Conference West '95, Reed Exhibition Companies, Anaheim, CA, Feb. 25-29, 1996, pp. 702-711.

Hutchins, C.L., "Understanding Grid Array Packages", Surface Mount Technology Magazine, IHS Publishing Group, Nov. 1994, vol. 8, No. 11, pp. 12-13.

Hwang, J.S., "Reliability of BGA Solder Interconnections", Surface Mount Technology Magazine, IHS Publishing Group, Sep. 1994, vol. 8, No. 9, pp. 14-15.

Hwang, J.S., "A Hybrid of QFP and BGA Architectures", Surface Mount Technology Magazine, IHS Publishing Group, Feb. 1995, vol. 9, No. 2, p. 18.

Johnson, R. et al., "A Feasibility Study of of Ball Grid Array Packaging", National Electronic Packaging and Production Conference East '93, Boston, Massachusetts, Jun. 14-17, 1993, pp. 413-422.

Johnson R. et al., "Thermal Characterization of 140 and 225 Pin Ball Grid Array Packages", National Electronic Packaging & Production Conference East '93, Boston, Massachusetts, Jun. 14-17, 1993, pp. 423-430.

Johnston, P., "Land Pattern Interconnectivity Schemes", Ball Grid Array National Symposium, Dallas, Texas, Mar. 29-30, 1995, pp. 2-21.

Johnston, P. "Printed Circuit Board Design Guidelines for Ball Grid Array Packages", Journal of Surface Mount Technology, Surface Mount Technology Association, Jan. 1996, vol. 9, pp. 12-18.

Kawahara, T. et al., "Ball Grid Array Type Package By Using of New Encapsulation Method", Proceedings of the 1995 International Electronics Packaging Conference, San Diego, CA, Sep. 24-27, 1995, pp. 577-587.

Knickerbocker, J.U. and Cole, M.S., "Ceramic BGA: A Packaging Alternative", Advanced Packaging, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", National Electronic Packaging and Production Conference West '95, IEEE, Feb. 26-Mar. 1995, Anaheim, California, pp. 1523-1529.

Kunkle, R., "Discrete Wiring for Array Packages", Ball Grid Array National Symposium, Dallas, Texas, Mar. 29-30, 1995, 9 pages.

Lall, B. et al, "Methodology for Thermal Evaluation of Multichip Modules", IEEE Transactions on Components, Packaging, and Manufacturing Technology Part A, IEEE, Dec. 1995, vol. 18, No. 4, pp. 758-764.

Lasance, C. et al., "Thermal Characterization of Electronic Devices with Boundary Condition Independent Compact Models", IEEE Transactions on Components, Packaging, and Manufacturing Technology Part A, IEEE Components, Packaging, and Manufacturing Technology Society, Dec. 1995, vol. 18, No. 4, pp. 723-731.

Lau, J., "Ball Grid Array Technology", McGraw-Hill Inc., 1995, entire book submitted.

Lau, J. et al., "No Clean Mass Reflow of Large Plastic Ball Grid Array Packages", Circuit World, Wela Publications Ltd., vol. 20, No. 3, Mar. 1994, pp. 15-22.

"Literature Review", Special Supplement to Electronic Packaging & Production, Feb. 1995, Cahners Publication, 10 pages.

LSI LOGIC Package Selector Guide, Second Edition, LSI Logic Corporation, 1994-1995, entire document submitted.

"LTCC MCMs Lead to Ceramic BGAs," Advanced Packaging, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", Journal of Surface Mount Technology, Surface Mount International, Oct. 1994, pp. 33-41.

Marrs, R.C. and Olachea, G., "BGAs For MCMs: Changing Markets and Product Functionality", Advanced Packaging, IHS Publishing Group, Sep./Oct. 1994, vol. 1994, vol. 3, No. 5, pp. 48, 50, and 52.

Matthew, L.C. et al., "Area Array Packaging: KGD in a Chip-Sized Package", Advanced Packaging, IHS Publishing Group, Jul./Aug. 1994, pp. 91-94.

Mawer, A. et al., "Plastic BGA Solder Joint Reliability Considerations", Surface Mount International Conference Proceedings, Surface Mount International, Aug. 28-Sep. 1, 1994, San Jose, California, pp. 239-251.

Mazzullo, T. and Schaertl, L., "How IC Packages Affect PCB Design", Surface Mount Technology Magazine, Feb. 1995, vol. 9, No. 2, pp. 114-116.

Mearig, J., "An Overview of Manufacturing BGA Technology", National Electronic Packaging and Production Conference West '95, Feb. 26-Mar. 2, 1995, Anaheim, California, pp. 295-299.

Mertol, A., "Application of the Taguchi Method on the Robust Design of Molded 225 Plastic Ball Grid Array Packages", IEEE Transactions on Components, Packaging, and Manufacturing Technology Part B: Advanced Packaging, IEEE, Nov. 1995, vol. 18, No. 4, pp. 734-743.

Mescher, P. and Phelan, G., "A Practical Comparison of Surface Mount Assembly for Ball Grid Array Components", Surface Mount International Conference Proceedings, Surface Mount International, Aug. 28-Sep. 1, 1994, San Jose, California, pp. 164-168.

Mulgaonker, S. et al., "An Assessment of the Thermal Performance of the PBGA Family", Eleventh Annual IEEE Semiconductor Thermal Measurement and Management Symposium, IEEE, San Jose, CA, Feb. 7-9, 1995,pp. 17-27.

"New PBGA Pushes Technology to Outer Limits", Advanced Packaging, IHS Publishing Group, Jan./Feb. 1995, p. 11.

Olachea, G., "Managing Heat: A Focus on Power IC Packaging", Electronic Packaging & Production (Special Supplement), Cahners Publishing Company, Nov. 1994, pp. 26-28.

"Pad Array Improves Density", Electronic Packaging & Production, Cahners Publishing Company, May 1992, pp. 25-26.

Partridge, J. and Viswanadham, P., "Organic Carrier Requirements for Flip Chip Assemblies", Journal of Surface Mount Technology, Surface Mount Technology Association, Jul. 1994, pp. 15-20.

Ramirez, C. and Fauser, S., "Fatique Life Comparison of The Perimeter and Full Plastic Ball Grid Array", Surface Mount International Conference Proceedings, Surface Mount International, Aug. 28-Sep. 1, 1994, San Jose, California, pp. 258-266.

Rogren, P., "MCM-L Built on Ball Grid Array Formats", National Electronic Packaging and Production Conference West '94, Anaheim, California, pp. 1277-1282.

Rooks, S., "X-Ray Inspection of Flip Chip Attach Using Digital Tomosynthesis", Surface Mount International, Proceedings of The Technical Program, Aug. 28-Sep. 1, 1994, San Jose, California, pp. 195-202.

Rukavina, J., "Attachment Methodologies: Ball Grid Array Technology", Ball Grid Array National Symposium, Dallas, Texas, Mar. 29-30, 1995, 37 pages.

Sack, T., "Inspection Technology", Ball Grid Array National Symposium, Dallas, Texas, Mar. 29-30, 1995, pp. 1-41.
Sakaguchi, H., "BGA MountingTechnology,", pp. 1-4, date and source unknown.
Schmolze, C. and Fraser, A., "SPICE Modeling Helps Enhance BGA Performance", Electronic Packaging & Production, Jan. 1995, pp. 50-52.
Semiconductor Group Package Outlines Reference Guide, Texas Instruments, 1995, entire document submitted.
Shimizu, J., "Plastic Ball Grid Array Coplanrity", Surface Mount International Conference, San Jose, California, Aug. 31-Sep. 2, 1993, pp. 86-91.
Sigliano, R., "Using BGA Packages: An Appealing Technology in a QFP and Fine-Pitch Market", Advanced Packaging, IHS Publishing Group, Mar./Apr. 1994, pp. 36-39.
Sirois, L., "Dispensing for BGA: Automated Liquid Dispensing in a High-Density Environment", Advanced Packaging, IHS Publishing Group, May/Jun. 1995, pp. 38 and 41.
Solberg, V., "Interconnection Structure Preparation: Impact of Material Handling and PCB Surface Finish on SMT Assembly Process Yield", Ball Grid Array National Symposium, Dallas Texas, Mar. 29-30, 1995, 10 pages.
"Survival of the Fittest", Advanced Packaging, IHS Publishing Group, Mar./Apr. 1995, page unknown.
Tuck, J., "BGA Technology Branches Out", Circuits Assembly, Feb. 1995, vol. 6, No. 2, pp. 24, 26, and 28.
"Tutorial and Short Courses", 45th Electronic Components & Technology Conference, May 21-24, 1995, Las Vegas, Nevada, IEEE, 6 pages.
Vardaman, E. J. and Crowley, R. T., "Worldwide Trends In Ball Grid Array Developments", National Electronic Packaging and Production Conference West '96, Reed Exhibition Companies, Anaheim, CA, Feb. 25-29, 1996, pp. 699-701.
Walshak, D. and Hashemi, H., "Thermal Modeling of a Multichip BGA Package", National Electronic Packaging and Production Conference West '94, Reed Exhibition Companies, Anaheim, California, Feb. 27-Mar. 4, 1994, pp. 1266-1276.
Walshak, D. and Hashemi, H. "BGA Technology: Current and Future Direction for Plastic, Ceramic and Tape BGAs", Surface Mount International Conference Proceedings, Surface Mount International, Aug. 28-Sep. 1, 1994, San Jose, California, pp. 157-163.
Xie, H. et al., "Thermal Solutions to Pentium Processors in TCP in Notebooks and Sub-Notebooks", 45th Electronic Components & Technology Conference, IEEE, Las Vegas, NV, May 21-24, 1995, pp. 201-210.
Yip, W.Y., "Package Characterization of a 313 Pin BGA", National Electronic Packaging and Production Conference West '95, Reed Exhibition Companies, Feb. 26-Mar. 2, 1995, Anaheim, California, pp. 1530-1541.
Zamborsky, E., "BGAs in the Assembly Process", Circuits Assembly, Feb. 1995, vol. 6, No. 2, pp. 60, 62-64.
Zimerman, M., "High Performance BGA Molded Packages for MCM Application", Surface Mount International Conference Proceedings, Surface Mount International, Aug. 28-Sep. 1, 1994, San Jose, California, pp. 175-180.
Zweig, G., "BGAs: Inspect the Process, Not the Product", Electronic Packaging & Production (Special Supplement), Cahners Publishing Company, Aug. 1994 (Supplement), p. 41.
Houghten, J.L., "Plastic Ball-Grid Arrays Continue To Evolve", Electronic Design, Feb. 6, 1995, pp. 141-146.
Marrs, R. et al., "Recent Technology Breakthroughs Achieved with the New *Super*BGA® Package", 1995 International Electronics Packaging Conference, San Diego, California, Sep. 24-27, 1995, pp. 565-576.
Hayden, T.F. et al., "Thermal & Electrical Performance and Reliability Results for Cavity-Up Enhanced BGAs", Electronic Components and Technology Conference, IEEE,1999, pp. 638-644.
Thompson, T., "Reliability Assessment of a Thin (Flex) BGA Using a Polyimide Tape Substrate", International Electronics Manufacturing Technology Symposium, IEEE, 1999, pp. 207-213.

English-language Abstract of JP 10-189835, published Jul. 21, 1998, 2 pages (last visited Mar. 14, 2003).
English-language Abstract of JP 10-247703, published Sep. 14, 1998, 1 page.
English-language Abstract of JP 2000-286294, published Oct. 13, 2000, 2 pages (last visited Mar. 14, 2003).
English-language Abstract of JP 2001-68512, published Mar. 16, 2001, 1 page (last visited Oct. 2, 2002).
English-language Abstract of JP 10-247702, published Sep. 14, 1998, 2 pages (last visited Jan. 25, 2002).
English-language Abstract of JP 10-50877, published Feb. 20, 1998, 1 page (last visited Oct. 2, 2002).
English-language Abstract of JP 11-17064, published Jan. 22, 1999, 1 page.
English-language Abstract of JP 11-102989, published Apr. 13, 1999, 1 page.
English-language Abstract of JP 7-283336, published Oct. 27, 1995, 1 page.
English-language Abstract of JP 61-49446, published Mar. 11, 1986, 1 page.
Karnezos, M. , "An EPBGA Alternative," *Advanced Packaging*, Jun. 1998, pp. 90, 92, 94, and 96.
Zhao, Z., Ph.D., "Thermal Design and Modeling of Packages," *IEEE Short Courses*, Broadcom Corporation, Oct. 25, 2000, 95 pages.
Zhao, Z., Ph.D., "IC Package Thermal Issues and Thermal Design," ASAT, Inc., Jan. 15, 2000, 98 pages, presented at $2^{nd}$ International Icepak User's Group Meeting, Palo Alto, CA, on Feb. 7, 2000.
Heitmann, R., "A Direct Attach Evolution: TAB, COB and Flip Chip Assembly Challenges", Advanced Packaging, IHS Publishing Group, Jul./Aug. 1994, vol. 3, No. 4, pp. 95-99 and 103.
Written Primary Examination Decision of Rejection issued by the Taiwan Patent Office (with English translation attached) 5 pages.
Amkor package data sheet, "SuperFC®", from http://www.amkor.com/Products/all_datasheets/superfc.pdf, 2 pages (Jan. 2003).
Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).
Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).
Freyman, B. and Petrucci, M., "High-Pincount BGAs," *Advanced Packaging*, pp. 44-46, An IHS Group Publication (May/Jun. 1995).
Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).
Harper, C.A. (ed.), *Electronic Packaging And Interconnection Handbook*, Third Edition, pp. 7.58-7.59, ISBN No. 0-07-134745-3, McGraw-Hill Companies (2000).
Lin, S. and Chang, N., "Challenges in Power-Ground Integrity," *Proceedings Of The 2001 International Conference On Computer-Aided Design*, pp. 651-654 (Nov. 4-8, 2001).
Lloyd, J. and Overhauser, D., "Electromigration wreaks havoc on IC design," *EDN*, pp. 145-148 (Mar. 26, 1998).
Song, W.S. and Glasser, L.A., "Power Distribution Techniques for VLSI Circuits," *IEEE Journal Of Solid-State Circuits*, vol. SC-21, No. 1, pp. 150-156 (Feb. 1986).
Tang, K.T. and Friedman, E.G., "Simultaneous Switching Noise in On-Chip CMOS Power Distribution Networks," *IEEE Transaction On Very Large Scale Integration (VLSI) Systems*, vol. 10, No. 4, pp. 487-493 (Aug. 2002).
Zhao, S. et al., U.S. Appl. No. 10/870,927, filed Jun. 21, 2004, entitled "Apparatus and Method for Thermal and Electromagnetic Interference (EMI) Shielding Enhancement in Die-up Array Packages".
Khan, R. et al., U.S. Appl. No. 10/952,172, filed Sep. 29, 2004, entitled "Die Down Ball Grid Grid Array Packages and Method for Making Same".
English Abstract for French Patent Publication No. FR2803098, 1 page, from http://v3.espacenet.com.

* cited by examiner stiffener temperature distribution

BALL GRID ARRAY PACKAGE WITH SEPARATED STIFFENER LAYER

CROSS-REFERENCE TO RELATED APPLICATIONS

This application claims the benefit of U.S. Provisional Application No. 60/352,877, filed Feb. 1, 2002, which is herein incorporated by reference in its entirety.

The following applications of common assignee are related to the present application, have the same filing date as the present application, and are herein incorporated by reference in their entireties:

"Ball Grid Array Package Enhanced with a Thermal and Electrical Connector," Ser. No. 10/284,312;

"Ball Grid Array Package with Patterned Stiffener Layer," Ser. No. 10/284,340;

"Ball Grid Array Package with Stepped Stiffener Layer," Ser. No. 10/284,371;

"Ball Grid Array Package Fabrication with IC Die Support Structures," Ser. No. 10/284,349; and "Ball Grid Array Package with Multiple Interposers," Ser. No. 10/284,166.

BACKGROUND OF THE INVENTION

1. Field of the Invention

The invention relates generally to the field of integrated circuit (IC) device packaging technology and, more particularly, to improved substrate stiffening, heat spreading, and power delivery/current return techniques for ball grid array packages (BGAs).

2. Background Art

Integrated circuit (IC) dies are typically mounted in or on a package that facilitates attachment to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. In one type of BGA package, the IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the package, opposite of the side to which the solder balls are attached. In die-down BGA packages, the IC die is mounted on a bottom surface of the package, on the same side as which the solder balls are attached.

Existing BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than about 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207-213 (1999).

The tape substrate used in flex BGA packages is typically polyimide, which has very low values of thermal conductivity. Consequently, the IC die is separated from the PCB internally by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener for wire bond connections tend to reduce the thermal connections between the IC die and the edges of the stiffener. As a result, heat spreading is limited largely to the region of the IC die attach pad, while areas at the stiffener peripheral do not contribute effectively to heat spreading.

Furthermore, because substrate routing tends to have a high density, it is difficult to bond each power and ground pad on the IC die to the substrate by a corresponding bond finger. As a result, the distribution of ground and power signals connecting to the IC die is frequently compromised in conventional BGA packages.

Hence, what is needed are improved BGA packages with enhanced electrical, thermal and physical characteristics.

BRIEF SUMMARY OF THE INVENTION

Ball grid array (BGA) packages having enhanced electrical, thermal, and mechanical characteristics are described herein. Furthermore, improved assembly processes and structures are described. In aspects of the present invention, a BGA package, and a method of assembling the BGA package are described. A first stiffener is attached to a first surface of a substrate. A second stiffener is attached to the first surface of the substrate to be substantially co-planar with the first stiffener and to be separated from the first stiffener by a channel. An IC die is mounted to a surface of the first stiffener.

The BGA package with first and second co-planar stiffeners has many advantages. Rigidity of the BGA package is improved by introduction of the first and second stiffeners. One or both of the stiffeners aid in conducting heat from the mounted IC die. Furthermore, one or both of the first and second stiffeners may act as a power, ground, or other signal plane by coupling electrical signals to the first and/or second stiffeners.

In an aspect, a bond pad of the IC die is coupled to a contact pad on the first surface of the substrate with a wire bond that passes through the channel.

In a further aspect, a bond pad of the IC die is coupled with a wire bond to a surface of the first stiffener.

In a further aspect, a bond pad of the IC die is coupled with a wire bond to the surface of the second stiffener.

In a further aspect, a bond pad of the IC die is coupled with a wire bond to a contact pad on the first surface of the substrate through an opening through the first stiffener.

In a further aspect, a bond pad of the IC die is coupled with a wire bond to a contact pad on the first surface of the substrate through an opening through the second stiffener.

In a further aspect, a bond pad of the IC die is coupled to a contact pad on the first surface of the substrate with a wire bond through an opening through the second stiffener that has an edge that is open to the channel.

In another aspect of the present invention, a system and method for assembling a plurality of ball grid array (BGA) packages is described. A stiffener strip that includes a plurality of first stiffeners and a plurality of second stiffeners is formed. The stiffener strip is formed so that each first stiffener of the plurality of first stiffeners and a corresponding second stiffener of the plurality of second stiffeners have a corresponding channel located therebetween, and so that the plurality of first stiffeners and plurality of second stiffeners are co-planar. The stiffener strip is attached to a substrate strip that includes a plurality of substrates. Each first stiffener and corresponding second stiffener are attached to the first surface of a corresponding substrate of the plurality of substrates. An IC die is mounted to a surface of each second stiffener of the plurality of second stiffeners.

Further aspects, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
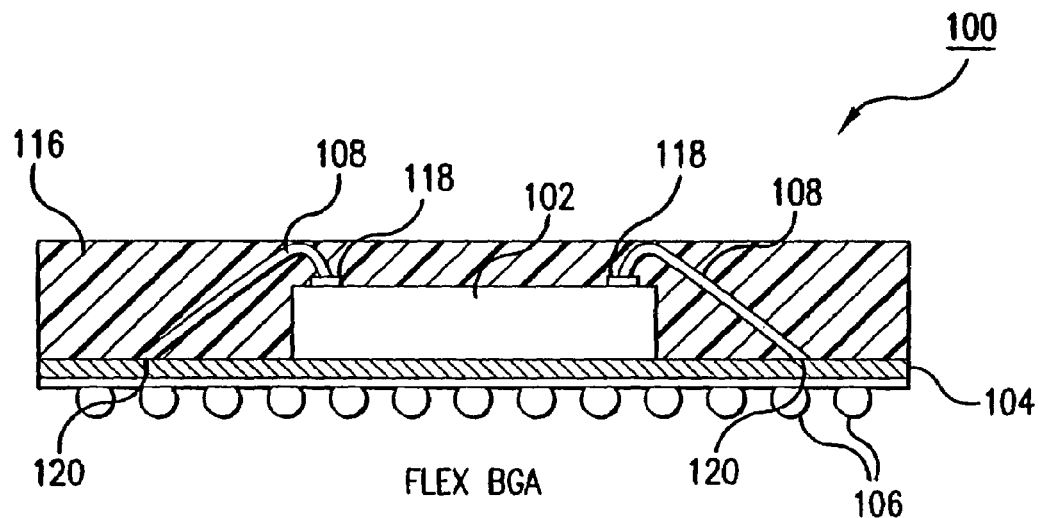
FIGS. 1A and 1B illustrate cross-sectional views of flex BGA packages.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to BGA packages having improved mechanical, thermal, and electrical performances. Furthermore, the present invention is directed to improved assembly processes for BGA packages. The present invention is applicable to all types of BGA package substrate types, including ceramic, plastic, and tape (flex) substrates. Furthermore the present invention is applicable to die-up (cavity-up) and die-down (cavity-down) orientations.

Numerous embodiments of the present invention are presented herein. First, ball grid array package types are described below. Next, BGA packages having multiple coplanar stiffeners are described. Then, details on assembling single and multiple BGA packages having multiple co-planar stiffeners, are described. The embodiments described herein may be combined as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover most or all of the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex") (for example, refer to Hayden, T. F., et al., *Thermal & Electrical Performance and Reliability Results for Cavity-Up Enhanced BGAs*, Electronic Components and Technology Conference, IEEE, pp. 638-644 (1999), which is incorporated herein by reference). FIG. 1A illustrates a flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of inputs and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor IC.

One or more wire bonds 108 connect corresponding bond pads 118 on IC die 102 to contact pads or points 120 on substrate 104.

An encapsulate 116, such as a mold compound, epoxy, or other encapsulating material, covers IC die 102 and wire bonds 108 for mechanical and environmental protection.

Figure 1B:
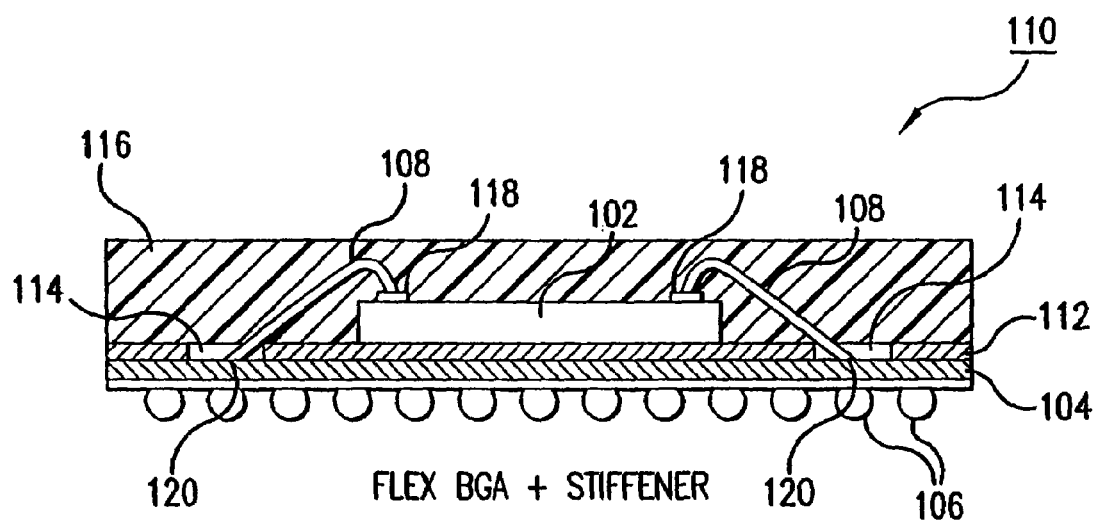

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated or otherwise attached to substrate 104. Stiffener 112 is typically made from a metal, or combination of metals, such as copper, tin, and aluminum, or may be made from a polymer and other materials, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
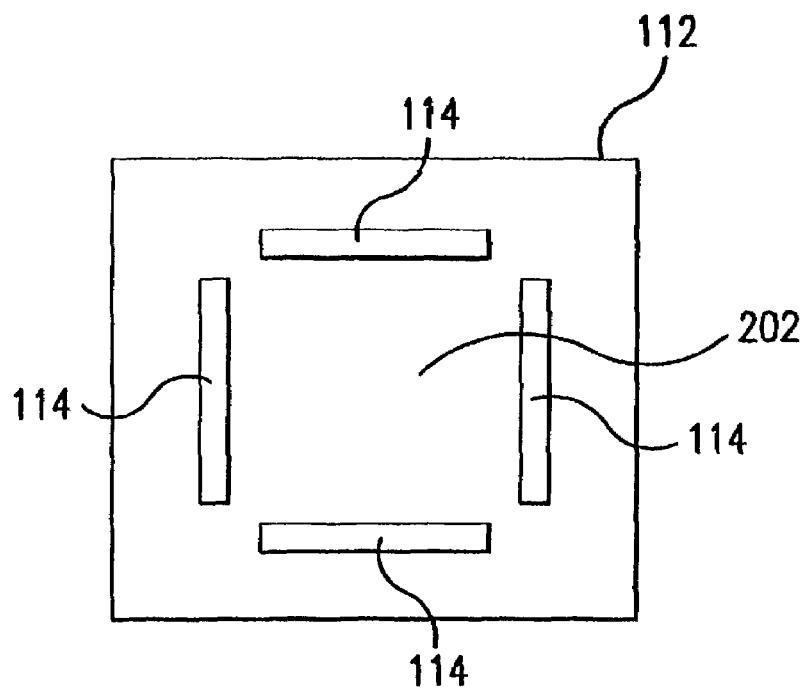
FIG. 2A shows a top view of a stiffener.
Figure 2B:
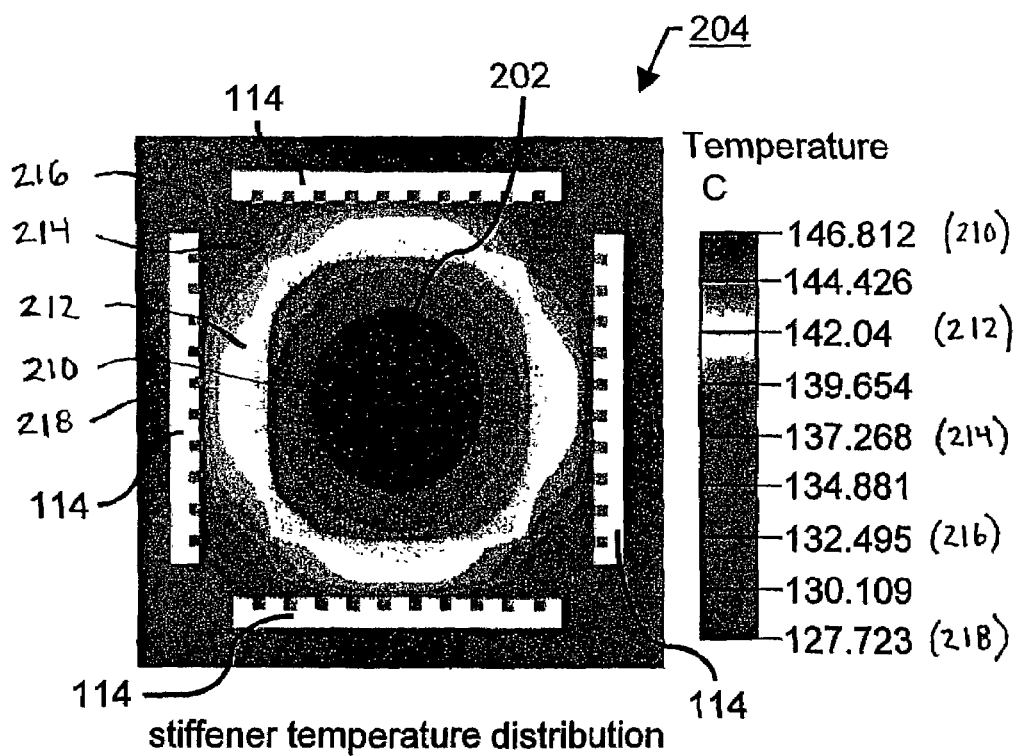
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
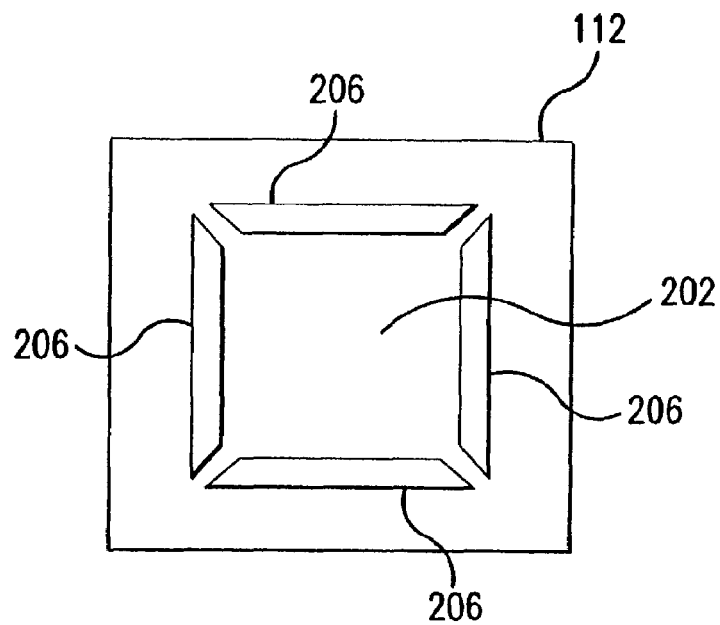
FIG. 2C shows a top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but have a different shape. The different shape can enhance thermal transfer to the outer areas of stiffener 112, for example. Further alternatively shaped openings in stiffener 112 are applicable to the present invention, including elliptical or rounded openings, etc.

Figure 3:
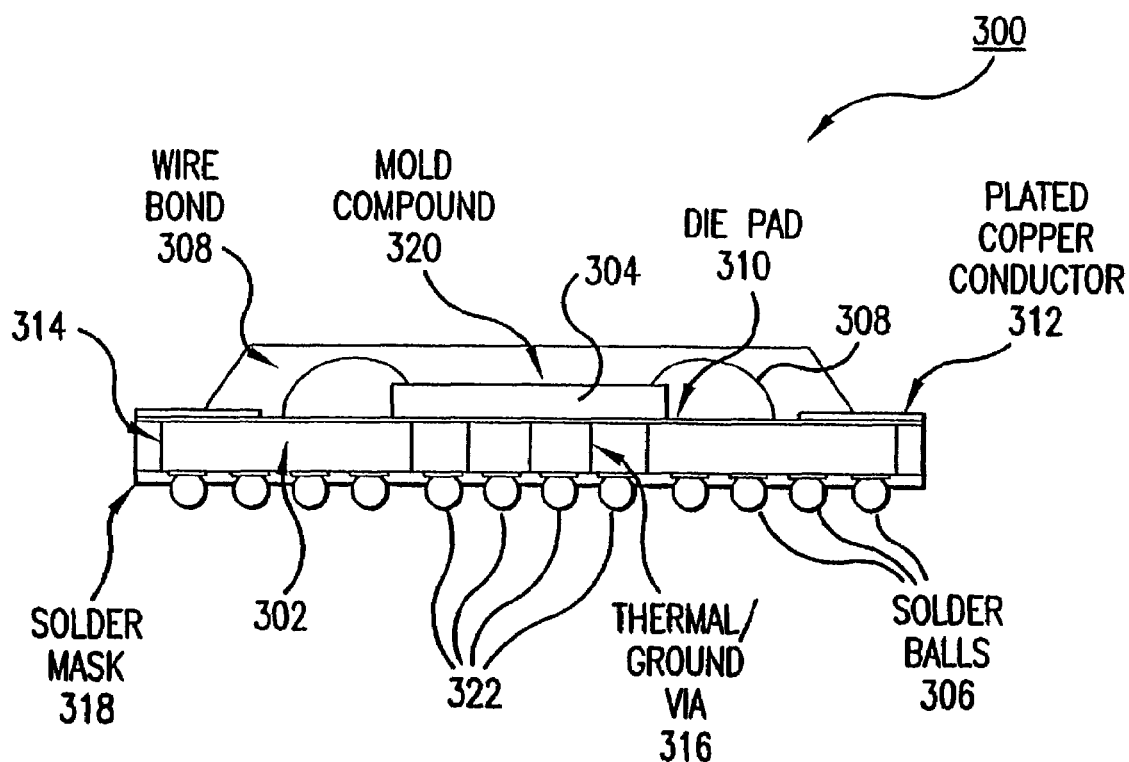
FIG. 3 shows a cross-sectional view of a die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate. For example, plastic or organic substrates may include materials such as "BT", which includes a resin called bis-maleimide triazine, and/or "FR-4," which is a fire-retardant epoxy resin-glass cloth laminate material, and/or other similar materials. IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 4A:
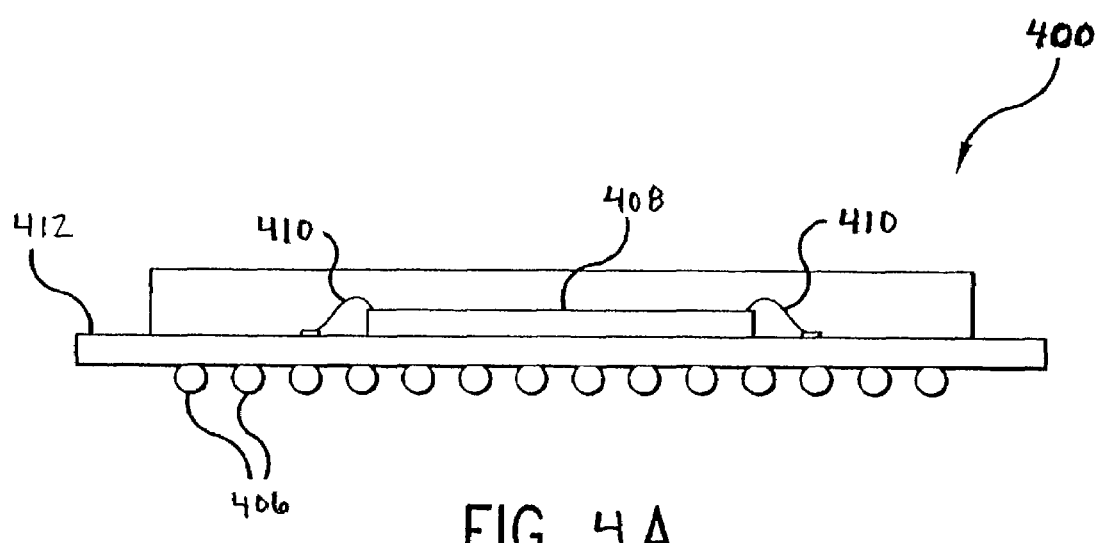
FIG. 4A illustrates a cross-sectional view of a die-up BGA package.
Figure 4B:
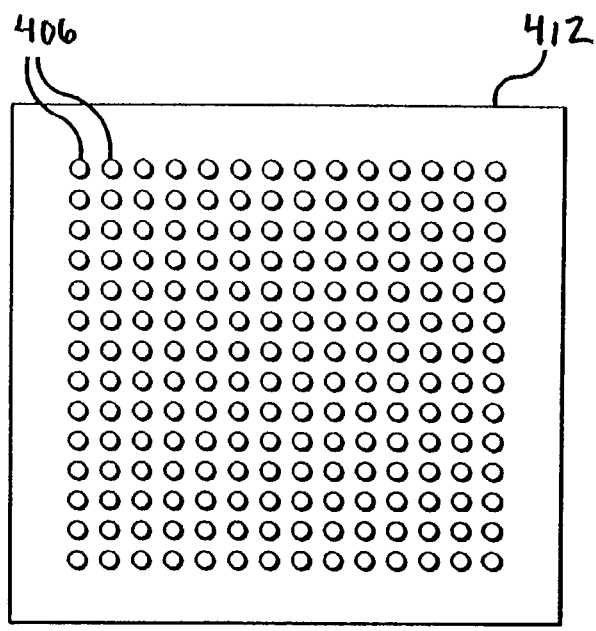
FIGS. 4B and 4C illustrate exemplary solder ball arrangements for the die-up BGA package of FIG. 4A.
Figure 4C:
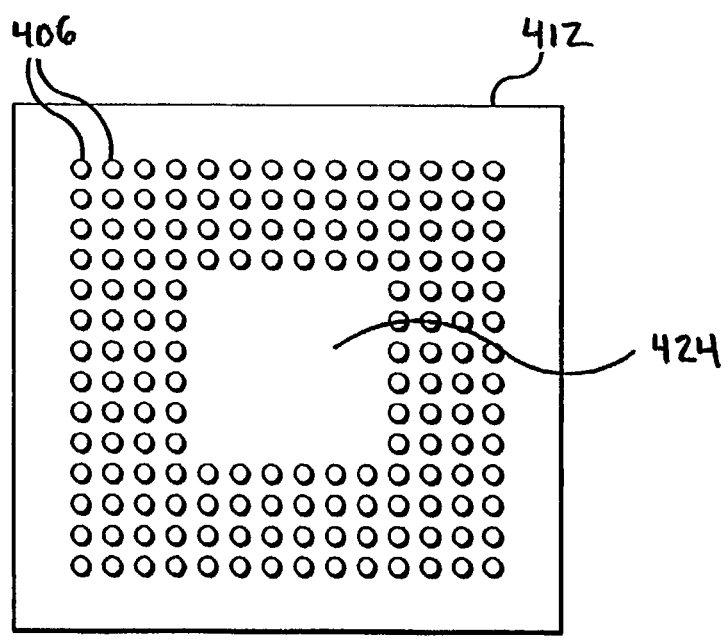

As described above, a BGA package includes an array of solder balls located on a bottom external surface of the package substrate. FIG. 4A illustrates a cross-sectional view of a die-up BGA package 400. FIGS. 4B and 4C illustrate exemplary solder ball arrangements for die-up BGA package 400. As shown in FIG. 4A, BGA package 400 includes an IC die 408 mounted on a substrate 412. IC die 408 is electrically connected to substrate 412 by one or more wire bonds 410. Wire bonds 410 are electrically connected to solder balls 406 underneath substrate 412 through corresponding vias and routing in substrate 412. The vias in substrate 412 can be filled with a conductive material, such as solder, to enhance these connections. Solder balls 406 are attached to substrate 412, and are used to attach the BGA package to a PCB.

Note that although wire bonds, such as wire bonds 410, are shown and described herein, IC dies may be mounted and coupled to a substrate with solder balls located on the bottom surface of the IC die, by a process commonly referred to as "C4" or "flip chip" packaging.

As shown in FIG. 4B, solder balls 406 may be arranged in an array. FIG. 4B shows a 14 by 14 array of solder balls on the bottom surface of BGA package 400. Other sized arrays of solder balls are also applicable to the present invention. Solder balls 406 are reflowed to attach BGA package 400 to a PCB. The PCB may include contact pads to which solder balls 406 are bonded. PCB contact pads are generally made from a metal or combination of metals, such as copper, nickel, tin, and gold.

FIG. 4C shows a bottom view of BGA package 400, with an alternative solder ball array arrangement. BGA package 400 attaches an array of solder balls 406 on a bottom surface of substrate 412. As shown in FIG. 4C, solder balls 406 are located in a peripheral area of the bottom surface of substrate 412, away from a substrate center 424. For example, solder balls 406 on the bottom surface of substrate 412 may be located outside an outer profile area of an IC die mounted on the opposite surface of substrate 412. The solder ball array may be organized in any number of ways, according to the requirements of the particular BGA package application.

The solder ball arrangement shown in FIG. 4C is particularly applicable to embodiments of the present invention that attach a heat spreader/heat sink/heat slug/thermal connector to a bottom surface of a BGA package. The heat spreader/heat sink/heat slug/thermal connector may be connected in substrate center 424, for example.

Figure 5:
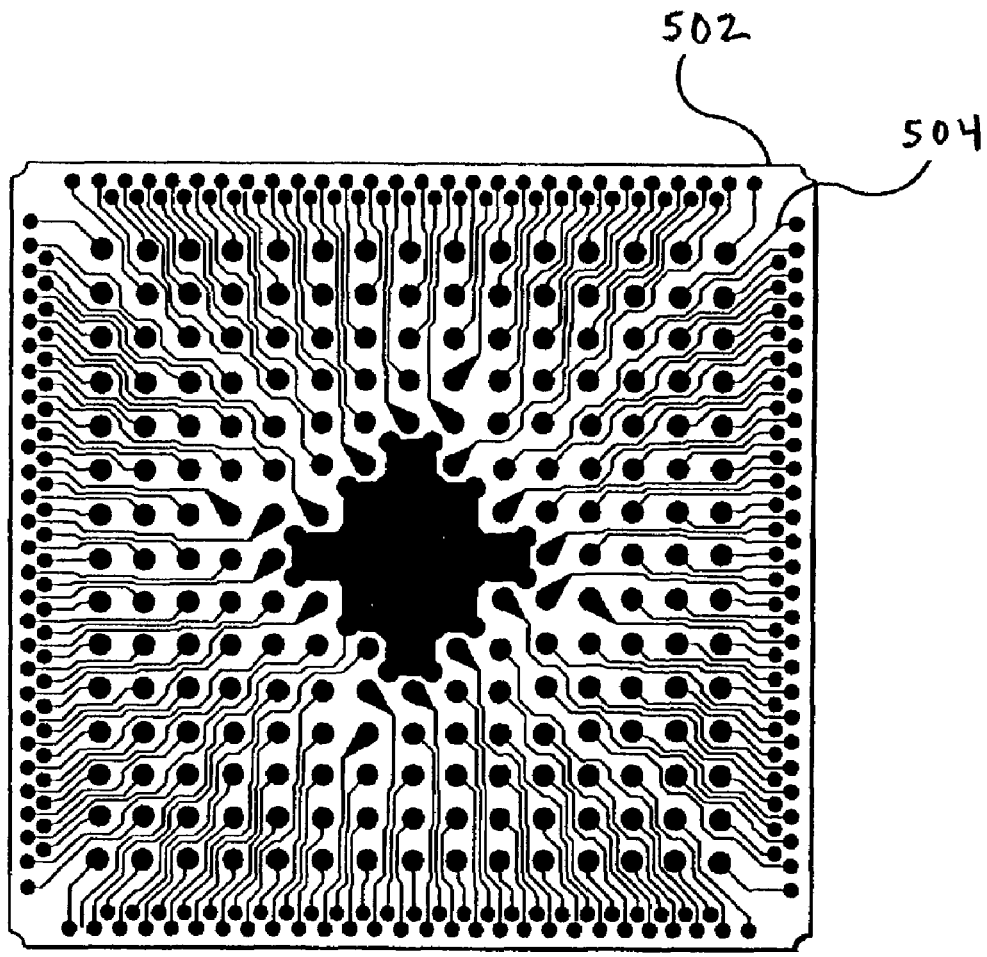
FIG. 5 shows exemplary routing in a substrate layer.

As described above, the BGA package substrate provides electrically conductive vias and routing on one or more electrically conductive layers to connect contact pads for wire bonds on its upper surface to solder balls attached to the bottom substrate surface. For illustrative purposes, FIG. 5 shows solder ball pads and routing 504 in an example bottom substrate layer 502.

The present invention is also applicable to improving thermal, mechanical, and electrical performance in the BGA package types described herein, and further BGA package types.

BGA Package Embodiments Having Multiple Co-Planar Stiffeners

According to embodiments of the present invention, a BGA package includes two or more co-planar stiffener elements. This section provides description of BGA packages with multiple co-planar stiffeners, according to the present invention. For illustrative purposes, the present invention is described in the context of elements of BGA packages 100 and 110 of FIGS. 1A and 1B, but the present invention is not limited to these example BGA package types. The present invention is applicable to all types of BGA packages, including tape and plastic substrate packages such as BGA packages 100, 110, and 300 described above, ceramic substrate BGA packages, and further BGA package types.

Figure 6:
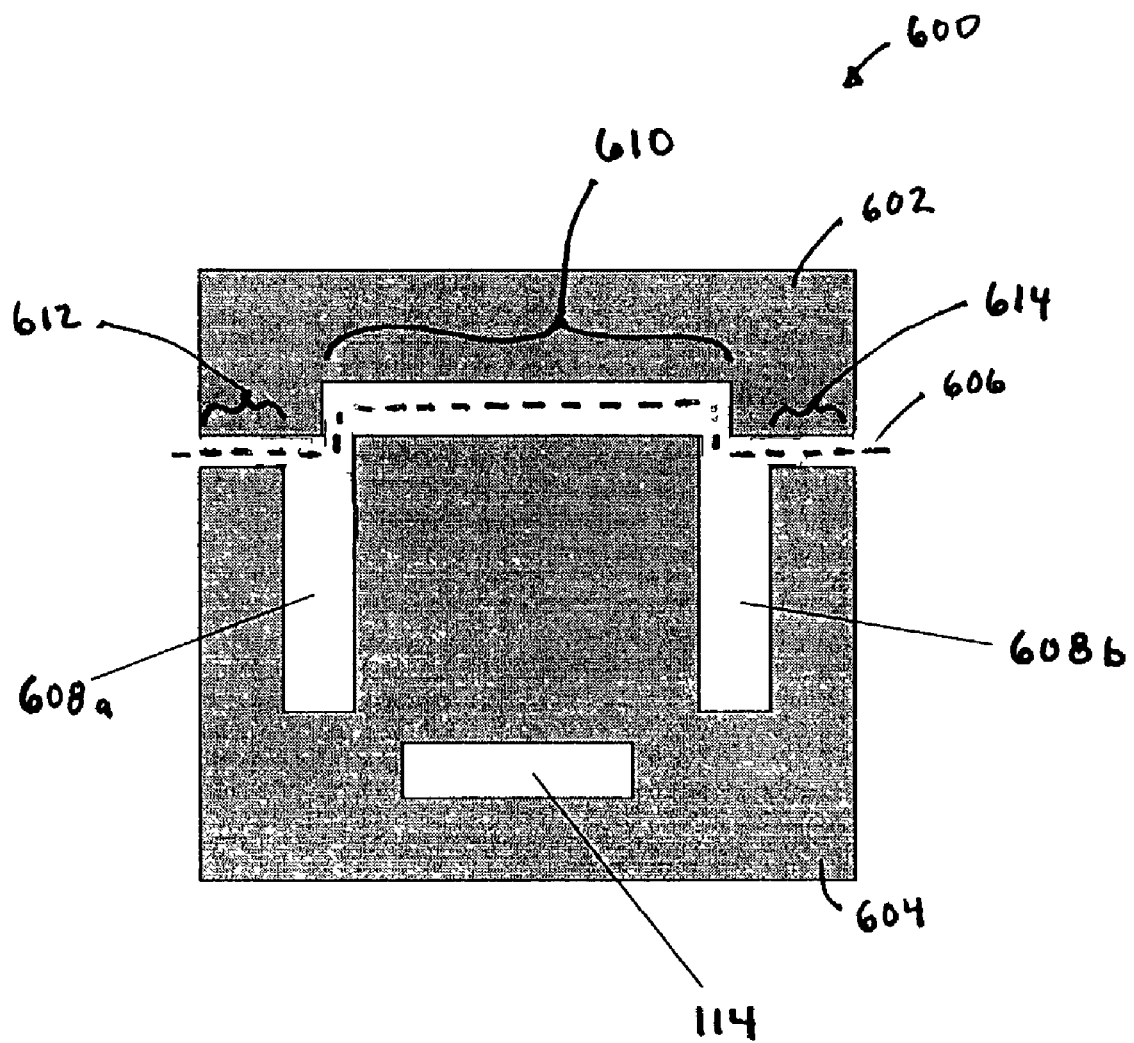
FIGS. 6-8 show example stiffener layers, according to embodiments of the present invention.
Figure 7:
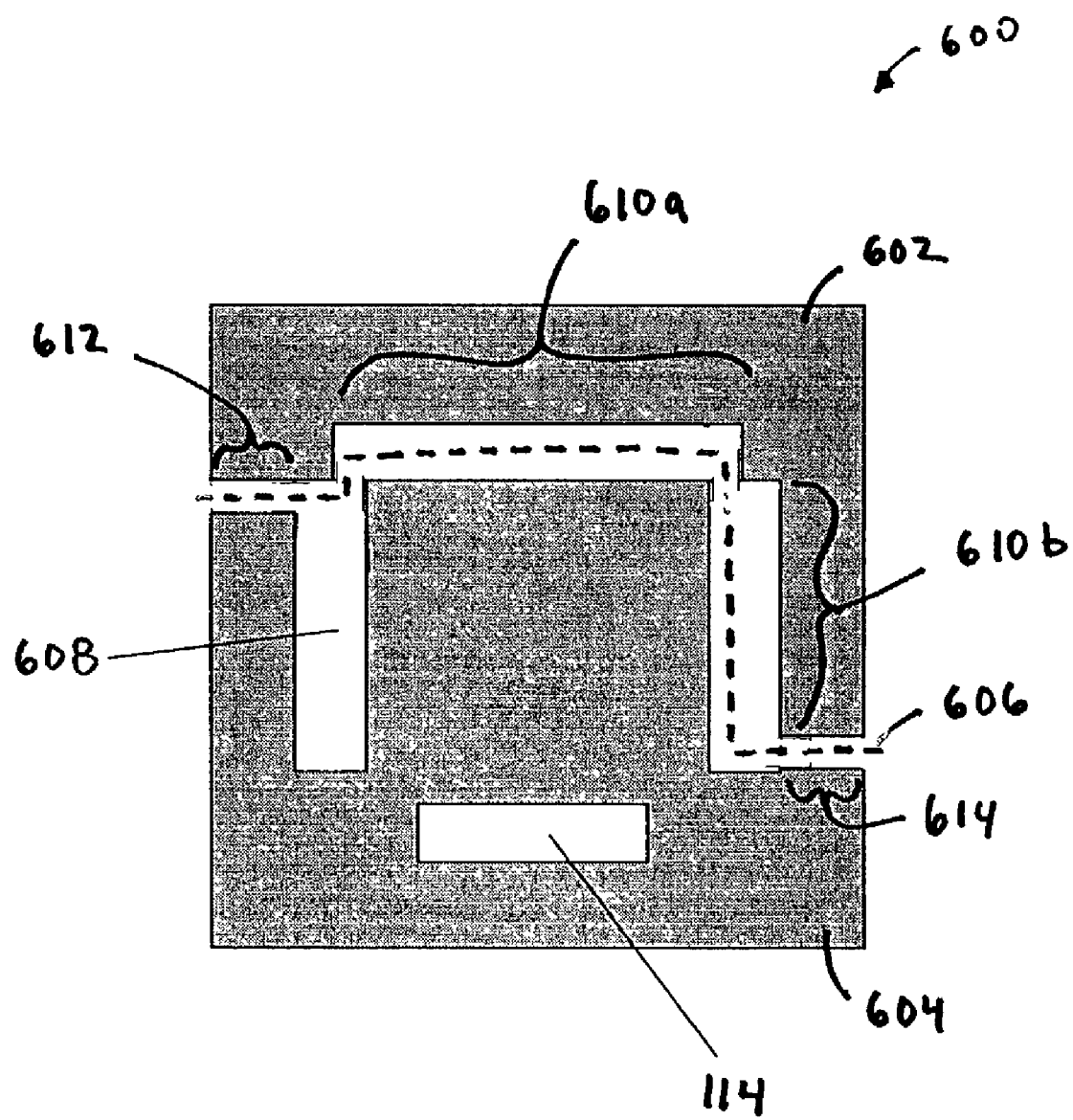
Figure 8:
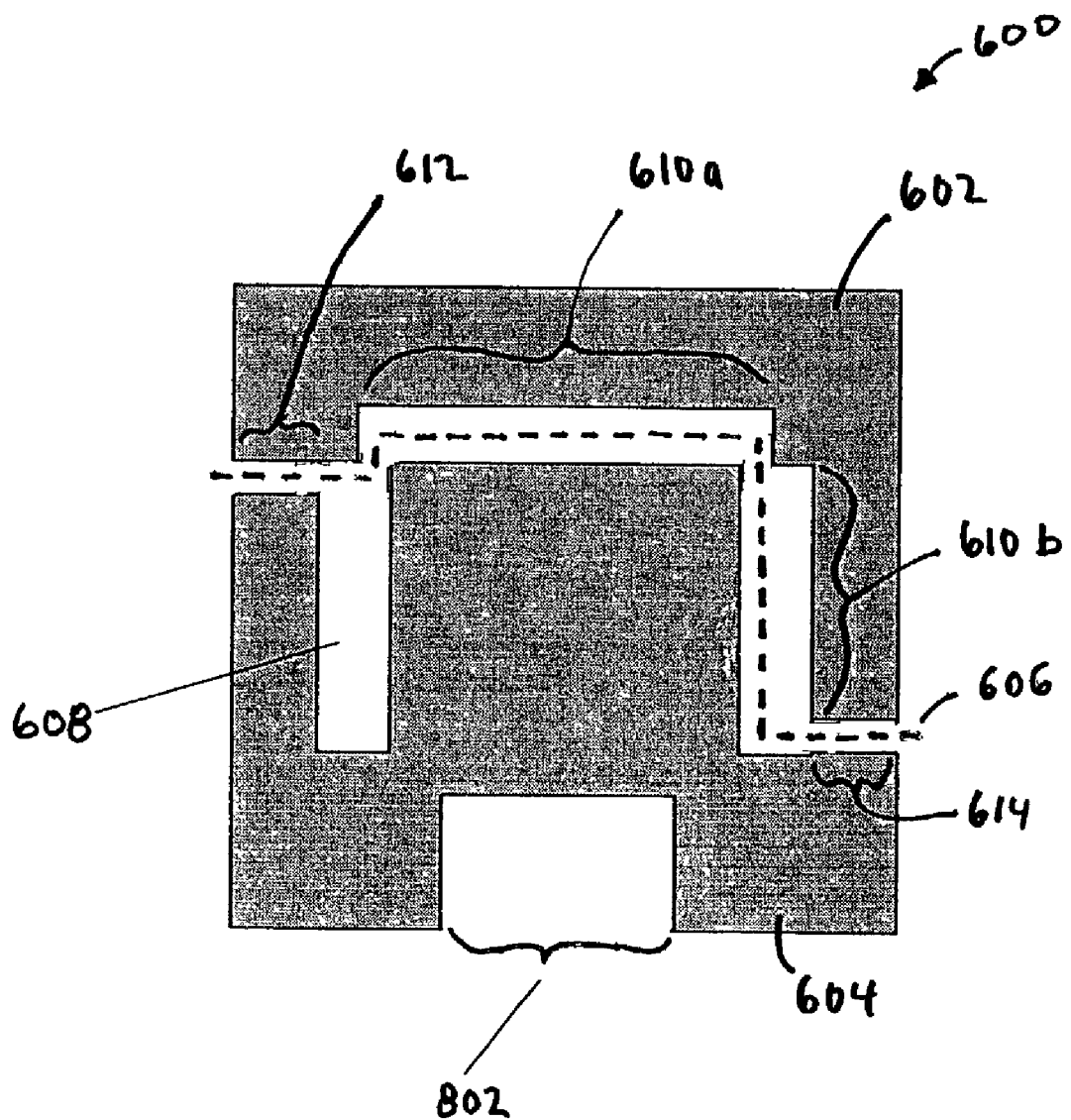

FIGS. 6-8 each show top or bottom views of example stiffener layers 600, according to embodiments of the present invention. Each stiffener layer 600 shown in FIGS. 6-8 includes two stiffener elements—a first stiffener 602 and a second stiffener 604—that are separated by a channel 606 (channel 606 is indicated by a dotted line in FIGS. 6-8). When incorporated in a BGA package, first and second stiffeners 602 and 604 provide numerous advantages. In further embodiments, stiffener layer 600 may include a third stiffener, and additional stiffeners, separated from each other by channels, or channel portions, to provide these and other advantages. For illustrative purposes, the present invention is described herein in terms of stiffener layer 600, which includes two stiffener elements. However, any number of stiffener elements may be included in stiffener layer 600 for use in a BGA package, according to the present invention.

As shown in FIGS. 6-8, first and second stiffeners 602 and 604, together with channel 606, form a substantially rectangular stiffener layer 600. In an embodiment, first and second stiffeners 602 and 604 are formed separately, and are arranged to form channel 606 between them. In another embodiment, first and second stiffeners 602 and 604 are formed from a single stiffener piece. In such an embodiment, the single stiffener piece may be separated or split to create channel 606 using a router or saw, by punching channel 606 into the single stiffener piece, by chemically etching channel 606, by laser cutting, or by other mechanisms and processes.

As described above, first and second stiffeners 602 and 604 are configured together in a BGA package to provide numerous advantages. First and second stiffeners 602 and 604 together operate similarly to stiffener 112 shown in FIG. 1B, by providing rigidity/stiffness to a BGA package. Furthermore, first and second stiffeners 602 and 604 may provide thermal and/or electrical performance advantages. In embodiments, first stiffener 602 and/or second stiffener 604 are thermally conductive and provide for heat spreading. In such embodiments, second stiffener 604, primarily, and first stiffener 602, secondarily, conduct heat away from an IC die mounted to a central region of second stiffener 604. Hence, first stiffener 600 and second stiffener 604 may also be referred to as heat sinks and heat spreaders. In further embodiments, first stiffener 602 and/or second stiffener 604 may be electrically conductive to operate as ground, power, and/or other signal planes. For example, first and/or second stiffeners 602 and 604 may be coupled to analog ground, digital ground, and one or more power potentials. In such embodiments, first stiffener 602 and/or second stiffener 604 may be coupled to ground, power, and/or other signals by wire bonds, and/or by other ways. First and second stiffeners 602 and 604 may also be referred to as "interposers."

First and second stiffeners 602 and 604, and channel 606 therebetween, may have a variety of shapes. For example, as shown in FIG. 6, first and second stiffeners 602 and 604, along with channel 606, form a substantially rectangular or square shape. In further embodiments, first and second stiffeners 602 and 604, together with channel 606, may form a substantially rectangular or square shape having one or more rounded corners, may form a substantially elliptical or round shape, and may form other shapes, including any polygon, depending on the particular application. First and second stiffeners 602 and 604 may have outer edges that coincide with outer edges of the BGA package, or may have edges that are located within, or extend outside those of the BGA package. By using various shapes for first and second stiffeners 602 and 604, numerous benefits may be achieved, including: (i) enhancement of heat spreading, (ii) an increase in the area available for attachment of one or more wire bonds to a stiffener and/or to the substrate, (iii) a decrease in wire bond lengths, (iv) improvement in the stiffness of the BGA package, and (v) improvement of the overall manufacturability of the BGA package.

In the example of FIG. 6, channel 606 has a first portion 612, a second portion 610, and a third portion 614. In embodiments, of the present invention, channel 606 may have any number of one or more portions, with respective widths, lengths, and directions relative to other portions of channel 606, as required by the particular application.

In embodiments, channel 606 may be relatively wide or narrow. In an embodiment, channel 606 is relatively narrow, to enhance the rigidity of the respective BGA package. In embodiments where first and second stiffener 602 and 604 are electrically isolated, channel 606 must be at least wide enough to maintain the electrical isolation between them. For example, in a narrow width embodiment for channel 606, channel 606 may have a width measured in mils or millimeters (mm), such as in the range of 0.1 to 2 mm.

One or both of first and second stiffeners 602 and 604 may include one or more openings for wire bonds to be coupled between IC die 102 and substrate 104, similarly to stiffener 112 of FIG. 1B, which includes wire bond openings 114. For example, as shown in FIG. 6, second stiffener 604 includes an opening 114. Openings 114 in first and second stiffeners 602 and 604 may have any shape, including round, rectangular, trapezoidal, elliptical, triangular, irregular, and any other polygon or shape. First and second stiffeners 602 and 604 may have any number of openings 114, as required by the particular application.

Furthermore, one or more wire bond openings in first and/or second stiffeners 602 and 604 may intersect with channel 606. For example, one or more wire bond openings may have an edge that is open to channel 606. As shown in FIG. 6, a first opening 608a has an edge open to first portion 612 of channel 606, and a second opening 608b has an edge open to third portion 614 of channel 606. Furthermore, channel 606 may be formed to pass through one or more wire bond openings. For example, as shown in FIG. 6, second portion 610 is a wider portion of channel 606 than are first and third portions 612 and 614. Hence, second portion 610 may also be considered to be a wire bond opening along channel 606.

FIG. 7 shows another example embodiment for first and second stiffeners 602 and 604, and channel 606. As shown in FIG. 7, channel 606 has a fourth portion 610b, that is wider than first and second portions 612 and 614. Hence, fourth portion 610b may be considered to be a second wire bond opening along channel 606, similarly to second portion 610 (indicated as 610a in FIG. 7).

One or more outer edges of first and/or second stiffeners 602 and 604 may be formed to have one or more recessed edge portions to allow wire bonds to be coupled between IC die 102 and substrate 104. For example, FIG. 8 shows an example of first and second stiffeners 602 and 604, where second stiffener 604 has a recessed edge portion 802, according to an embodiment of the present invention. Recessed edge portions 802 may have any shape, including round, rectangular, trapezoidal, elliptical, triangular, irregular, and another other polygon or shape.

Note that in alternative embodiments, first stiffener 602 and second stiffener 604 may be symmetrical. In other words, in such an embodiment, for example, if first stiffener 602 is rotated 180 degrees with respect to second stiffener 604, the stiffeners would have substantially the same shape and size. For instance, first and second stiffeners 602 and 604 could be symmetrical if channel 606 between them is a straight line centered between their outermost edges. In other symmetrical embodiments, channel 606 does not have to be a straight line. A symmetrical embodiment may have advantages in manufacturing, because a single mold, pattern, etc., could be used to form both of first stiffener 602 and second stiffener 604.

According to embodiments of the present invention, first and second stiffeners 602 and 604 can be made from a variety of materials. First and second stiffeners 602 and 604 can be made from the same materials, or from different materials. For example, first and second stiffeners 602 and 604 can be made from a metal, such as copper, a copper based alloy, aluminum, an aluminum based alloy, as well as other metals and combinations/alloys thereof. First and second stiffeners 602 and 604 can also be made from ceramic materials, thermally conductive dielectric materials, organic materials, plastics, and combinations of these materials, as would be apparent to persons skilled in the relevant art(s) based on the teachings described herein. In embodiments, first stiffener 602 and/or second stiffener 604 are made from an electrically conductive material to enhance their electrical properties. Additionally or alternatively, first stiffener 602 and/or second stiffener 604 may be made from thermally conductive materials to enhance their thermal characteristics.

The surfaces of first and second stiffeners 602 and 604 are not required to be finished. However, one or more surfaces of first stiffener 602 and/or second stiffener 604 may be finished. For example, surfaces of first and second stiffeners 602 and 604 may be finished using processes such as micro-etch or oxidation (including black oxides, for example) to promote adhesion of an encapsulating material to the stiffeners. In embodiments, a surface plating of a plating material, such as silver, solder, nickel, gold, or other metals and alloys thereof, may be applied to areas of one or more surfaces of first stiffener 602 and/or second stiffener 604 to create spot, strip, bar, ring, and other shape contact areas. The plating material may be used to enhance attachment of wire bonds to the stiffeners.

Figure 9:
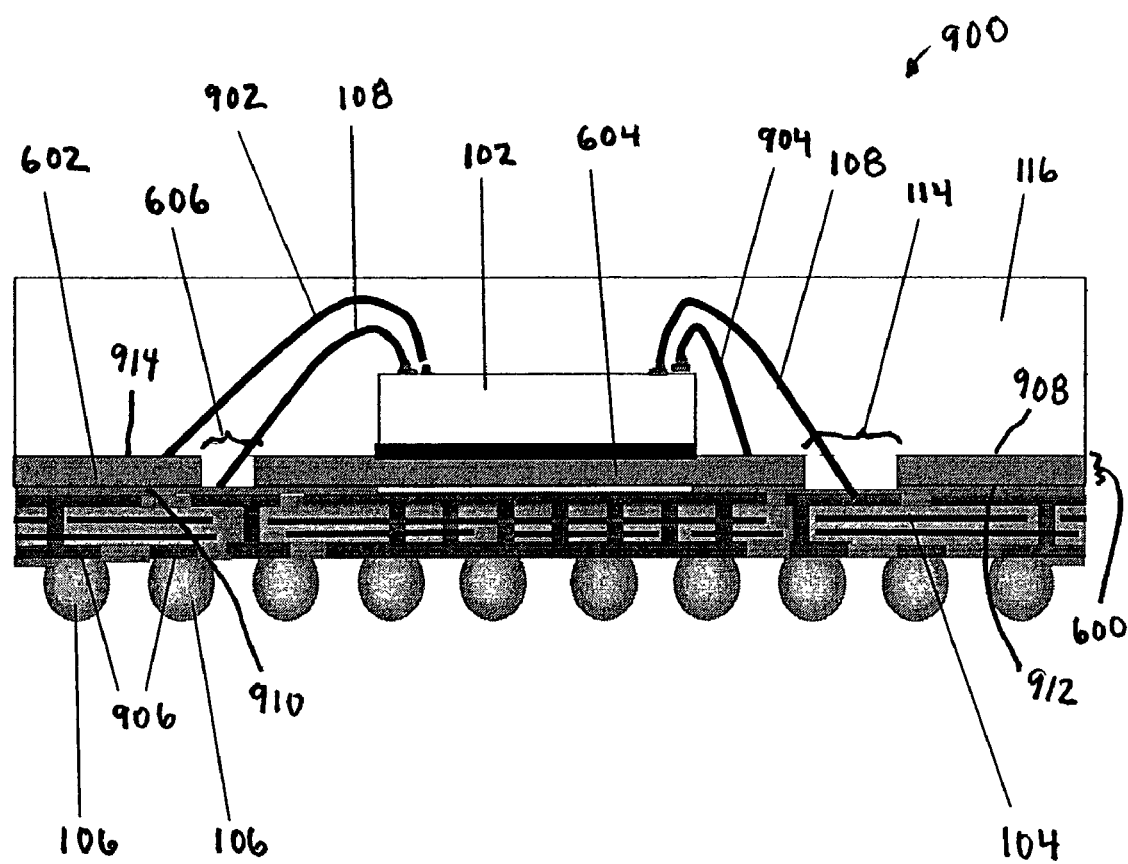
FIG. 9 shows an example BGA package, according to an embodiment of the present invention.

FIG. 9 shows an example BGA package 900 that includes first and second stiffeners 602 and 604, according to an embodiment of the present invention. As shown in FIG. 9, IC die 102 is mounted to a central region of a top surface 908 of second stiffener 604. For example, IC die 102 may be mounted to top surface 908 using an adhesive material. In embodiments, the adhesive material may be a thermally conductive adhesive material, to enhance transfer of heat from IC die 102 to second stiffener 604. For instance, the adhesive material may be an epoxy, such as a silver-filled epoxy, a laminate, a solder, or other adhesive materials.

Note that in an alternative embodiment, IC die 102 may be mounted across channel 606, so that a first portion of IC die 102 is mounted to a top surface 914 of first stiffener 602, and a second portion of IC die 102 is mounted to top surface 908 of second stiffener 604.

As shown in FIG. 9, a bottom surface 910 of first substrate 602 and a bottom surface 912 of second stiffener 604 are attached to a top surface of substrate 104 so that first and second stiffeners 602 and 604 are co-planar. First and second stiffeners 602 and 604 may be laminated, attached by adhesive tape, or be otherwise attached to substrate 104. First stiffener 602 and second stiffener 604 are arranged on substrate 104 so that channel 606 separates them. As a result, first and second stiffeners 602 and 604 are physically separated, and may or may not be electrically isolated, depending on the application.

In an embodiment where first stiffener 602 and second stiffener 604 are electrically isolated, first stiffener 602 and second stiffener 604 may be coupled to different signals, including separate ground, power, and other signals. In this manner, first stiffener 602 and/or second stiffener 604 may operate as isolated power, ground, and other signal planes. Furthermore, such a configuration can promote improved on-chip power delivery, reduce parasitic voltage drops, and improve current return. Alternatively, first and second stiffeners 602 and 604 may be electrically coupled by a wire bond, or other mechanism.

As shown in FIG. 9, a wire bond 108 is coupled from a bond pad on IC die 102 to a contact pad on the top surface of substrate 104. In embodiments, any number of wire bonds 108 may be used to couple respective bond pads of IC die 102 to contact pads on substrate 104. As shown in FIG. 9, a first wire bond 108 is coupled from a bond pad on IC die 102 to a contact pad on the top surface of substrate 104 through channel 606. Furthermore, a second wire bond 108 is coupled from a bond pad on IC die 102 to a contact pad on the top surface of substrate 104 through opening 114.

Furthermore, as shown in FIG. 9, one or more wire bonds 902 may be present to couple bond pads on IC die 102 to first stiffener 602. For example, wire bonds 902 may couple from bond pads on IC die 102 that are coupled to power, ground, or some other signal internal to IC die 102. Thus, wire bonds 902 couple these signals of IC die 102 to first stiffener 602, which may then operate as a ground, power, or signal plane to enhance electrical performance of BGA package 900. The connection area(s) on a top surface 914 of first stiffener 602 may be plated with a plating material to enhance the mechanical and electrical connection of wire bond(s) 902 to first stiffener 602.

Furthermore, one or more wire bonds 904 may additionally or alternatively be present to couple bond pads of IC die 102 to second stiffener 604, similarly to wire bonds 902 that couple to first stiffener 602. Hence, second stiffener 604 may operate as a ground, power, or signal plane, similarly to first stiffener 602. The connection area(s) on top surface 908 of second stiffener 604 may be plated with a plating material to enhance the mechanical and electrical connection of wire bond(s) 904 to second stiffener 604.

Furthermore, although not shown in FIG. 9, one or more wire bonds may additionally or alternatively be present to couple contact pads on substrate 104 to first and/or second stiffeners 602 and 604. For example, the contact pads may couple signals in substrate 104, such as power, ground, or other signals, to one or both of the stiffeners.

A plurality of solder ball contact pads 906 on a bottom surface of substrate 104 have a respective plurality of solder balls 106 attached thereto. Solder ball pads 906 are electrically coupled through substrate 104 to contact pads/lands on the top surface of substrate 104. Conductive areas/lands/fingers/traces/etc. on the top surface of substrate 104 that are wire bond attachable are referred to as "contact pads." Substrate 104 can be tape, organic (such as BT, FR4, etc.), ceramic, glass, other dielectric material, and any other substrate type, including those otherwise described herein, for example. Substrate 104 may have any number of one or more electrically conductive layers for routing. The electrically conductive and dielectric layers of substrate 104 may be constructed through lamination, build-up, and any other substrate construction process.

An encapsulate 116 is used to encapsulate IC die 102 and wire bonds on the top surfaces of first and second stiffeners 602 and 604, and substrate 104. For BGA package 900, encapsulate 116 is shown having edges that are formed by a saw singulation process. Encapsulate 116 may be formed in other ways, including as a "glob top," and by a molding compound shaped by a mold applied to the top of BGA package 900. In a glob top encapsulation embodiment, an encapsulating material is applied in a cavity formed by substrate 104, stiffeners 602 and 604, and a dam structure. The dam structure may be a material, such as an epoxy, that is formed in a ring to contain the encapsulating material when it is later applied. However, in the embodiments described herein, encapsulate 116 may be any form and type of encapsulation/encapsulating material, including glob top, molding compound, saw singulation, and epoxy.

Figure 10:
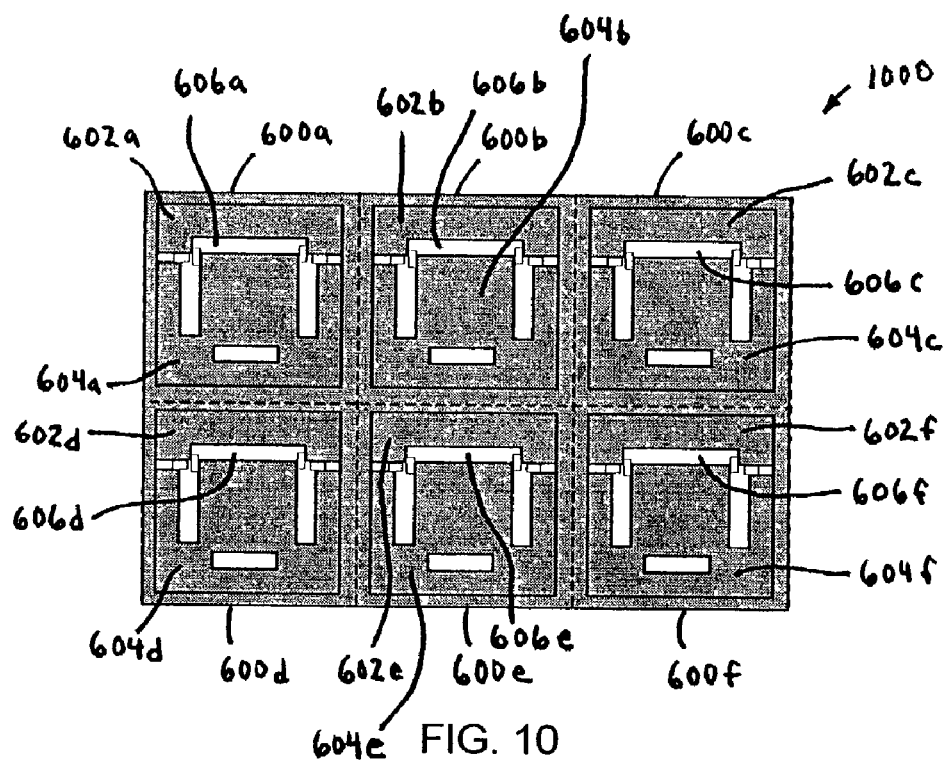
FIG. 10 shows an example panel of stiffeners, according to an embodiment of the present invention.
Figure 11:
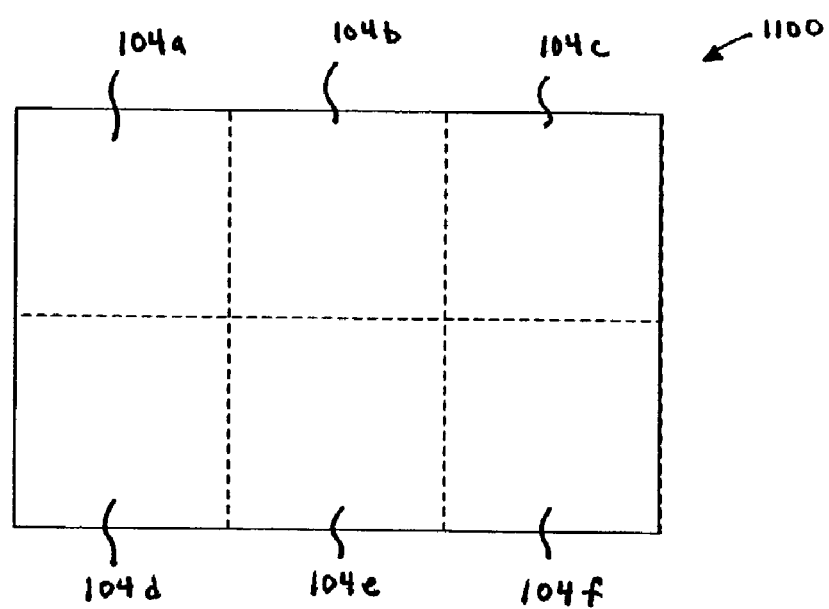
FIG. 11 shows an example panel of substrates, according to an embodiment of the present invention.

BGA packages according to the present invention may be assembled singly, or may be assembled in quantities greater than one at a time. For example, FIG. 10 shows an example panel 1000 that includes a six pairs of first and second stiffeners 602 and 604, according to an embodiment of the present invention. Panel 1000 includes six first stiffeners 602a-602f, six second stiffeners 604a-604f, and six channels 606a-606f. First stiffeners 602a-602f and second stiffeners 604a-604f may also include openings and recessed edge portions formed therethrough in panel 1000. FIG. 11 shows an example panel 1100 of substrates 104, according to an embodiment of the present invention. Panel 1100 shows six substrates 104a-104f (surface features of substrates 104a-f are not shown). Note that the present invention is applicable to panels having any number of stiffeners/substrates for assembling any number of BGA packages.

Figure 12:
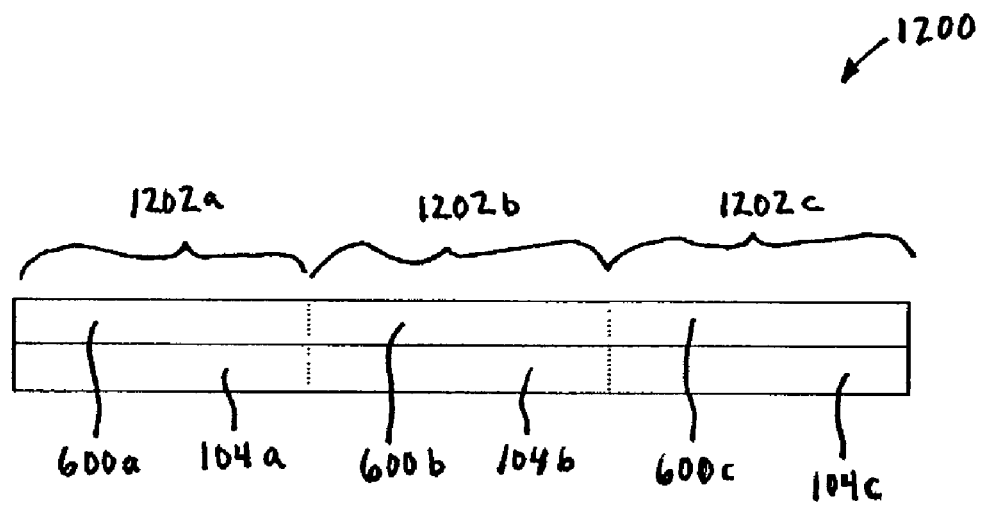
FIG. 12 shows an edge view of a combined stiffener/substrate panel, according to an embodiment of the present invention.

During an assembly process step for assembling a group of BGA packages, panel 1000 is attached to panel 1100 to form a combined stiffener strip/substrate strip panel. An edge view of an example combined stiffener strip/substrate strip panel 1200 is shown in FIG. 12, according to an embodiment of the present invention. As shown in FIG. 12, combined stiffener strip/substrate strip panel 1200 include several stiffener/substrate combinations 1202, including stiffener/substrate strip combinations 1202a, 1202b, and 1202c.

Further assembly process steps may be directed to combined stiffener strip/substrate strip panel 1200, including, for example: (i) attachment of the IC die to each stiffener/substrate combination 1202 in combined panel 1200, (ii) attachment of wire bonds between the IC die and contact pads on the substrate for each stiffener/substrate combination 1202 in combined panel 1200, (iii) attachment of wire bonds between the IC die and one or both of the first and second stiffeners 602 and 604 for each stiffener/substrate combination 1202 in combined panel 1200, (iv) encapsulation of the IC die and wire bonds for environmental protection for each stiffener/substrate combination 1202 in combined panel 1200, (v) attachment of solder balls to the substrate to each stiffener/substrate combination 1202 in combined panel 1200, and/or (vi) singulation of combined panel 1200 into individual BGA packages.

Figure 13:
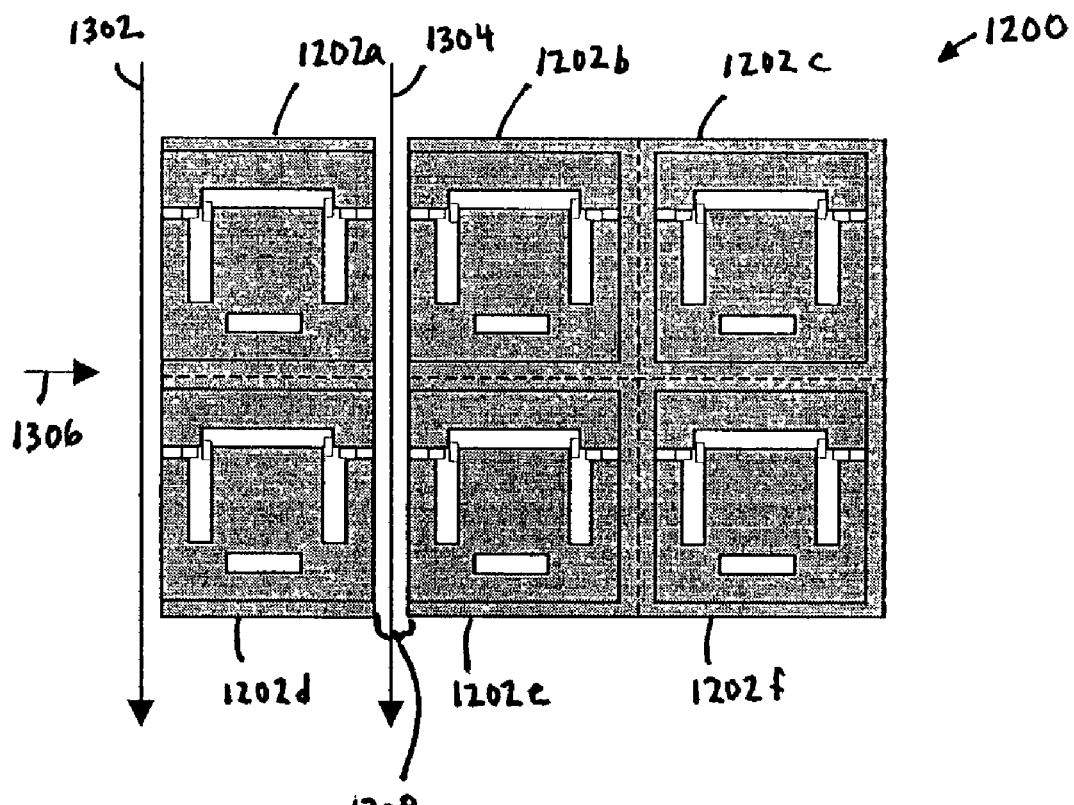
FIG. 13 shows BGA packages being separated from the combined stiffener/substrate panel of FIG. 12, according to an example embodiment of the present invention.

FIG. 13 illustrates separation of BGA packages from combined stiffener strip/substrate strip panel 1200 during an example singulation process, according to an embodiment of the present invention. In the example of FIG. 13, a first vertical cut 1302 and a second vertical cut 1304 are shown as arrows. A horizontal cut 1306, which has not yet been executed, is also shown as an arrow. Note that horizontal and vertical cuts may be made in any order to separate stiffener/substrate combinations 1202 from combined panel 1200. The singulation cuts may be accomplished in any number of ways, including by routing, sawing, punching, chemically etching, and laser cutting.

As shown in FIG. 13, second vertical cut 1304 removes material having a width 1308 from combined panel 1200. This material is removed from combined panel 1200 due to a width of a blade, bore, punch, or other instrument used to make second vertical cut 1304. First vertical cut 1302 may also remove material having a width from an edge of combined panel 1200. Note that in an alternative embodiment, first vertical cut 1302 may not be necessary if the stiffeners and substrates adjacent to the edge of combined panel 1200 coincide with the edge, so that no material need be removed from that edge of combined panel 1200.

In an embodiment, first stiffener 602 may be physically separated from second stiffener 604 after they have been attached to a substrate 104. For example, the separation may occur during the singulation process for combined panel 1200. For instance, if width 1308 is aligned to coincide with the ends of channel 606 (e.g., the ends of first and third portions 612 and 614 shown in FIGS. 6-8), first and second vertical cuts 1302 and 1304 will physically separate first and second stiffeners 602 and 604 from each other by removing the material of stiffener panel 1000 that joins them together.

Hence, first and second stiffeners 602 and 604 may be joined in panel 1000, and therefore may be attached to substrate 104 (i.e., panel 1100) during a single manufacturing or assembly process step. This has the advantage of allowing the dimensions of channel 606 to be formed and maintained in panel 1000, prior to attaching panel 1000 to panel 1100. First and second stiffeners 602 and 604 may then be split or separated from each other during the singulation process as described above, and the dimensions of channel 606 will be maintained due to the attachment of first and second stiffeners 602 and 604 to substrate 104. Alternatively, first and second stiffeners 602 and 604 may be individually attached to substrate 104, so that their separation during the BGA package singulation process is not necessary.

Figure 14A:
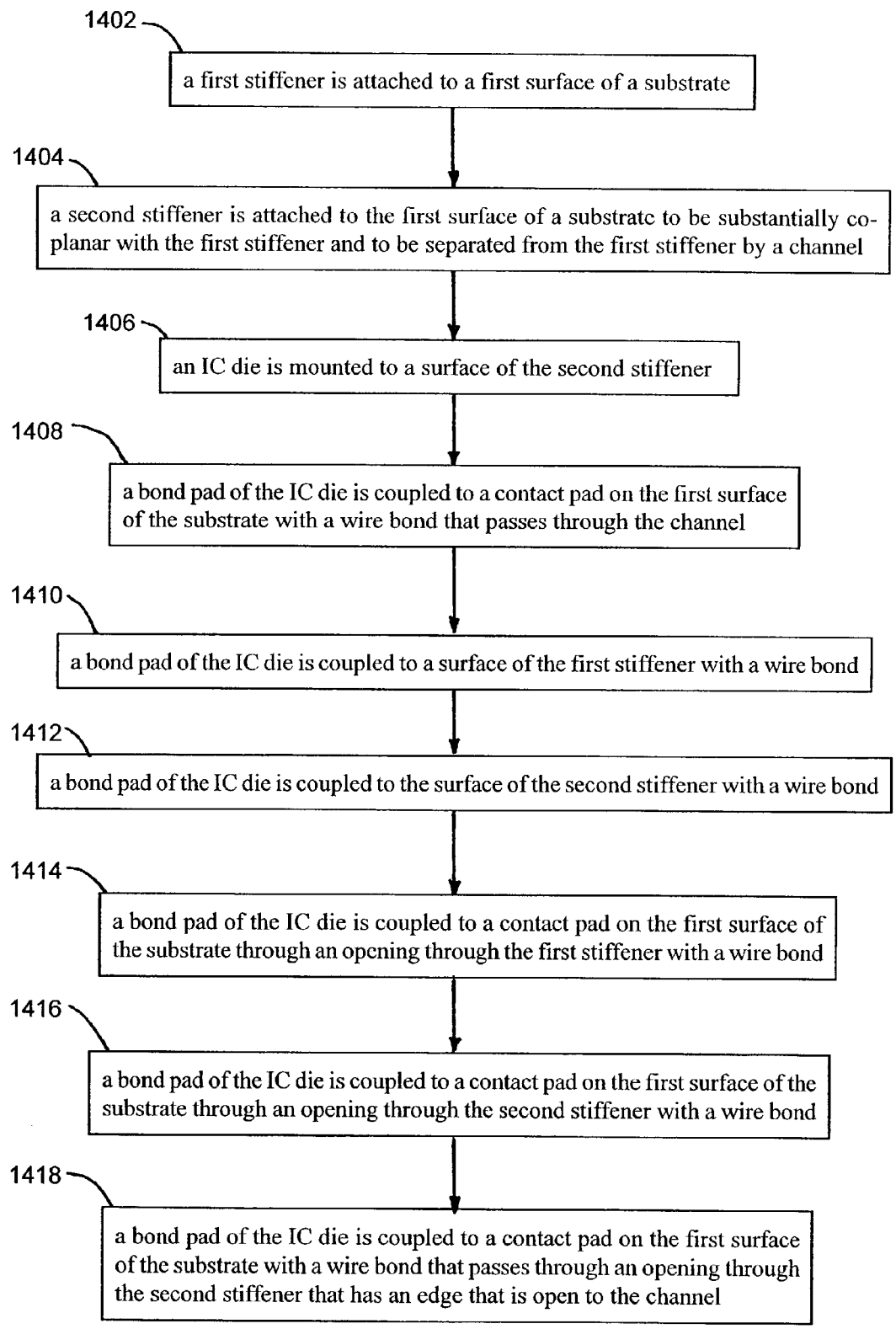
FIGS. 14A and 14B show flowcharts providing example steps for assembling a BGA package, according to embodiments of the present invention.
Figure 14B:
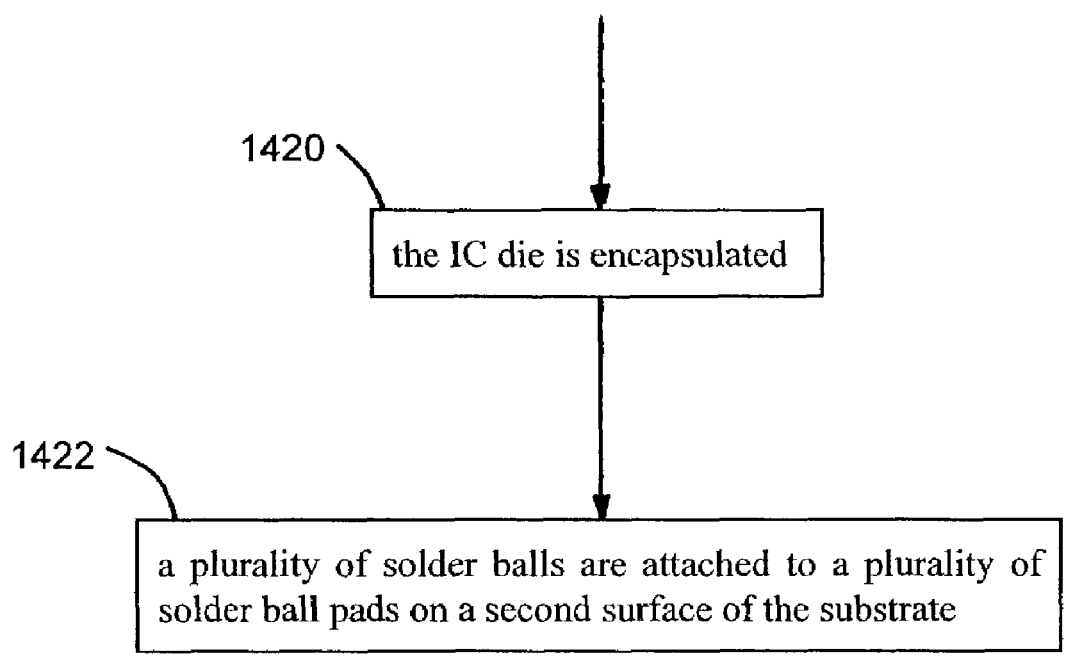

FIG. 14A shows a flowchart 1400 providing steps for assembling a BGA package according to one or more embodiments of the present invention. FIG. 14B provide additional optional steps, according to further embodiments of the present invention. Other operational and structural embodiments will be apparent to persons skilled in the relevant art(s) based on the following discussion. These steps are described in detail below.

Flowchart 1400 begins with step 1402. In step 1402, a first stiffener is attached to a first surface of a substrate. For example, the first stiffener is first stiffener 602, as shown in FIGS. 6-8. As shown in FIG. 9, first stiffener 602 is attached to the top surface of substrate 104.

In step 1404, a second stiffener is attached to the first surface of a substrate to be substantially co-planar with the first stiffener and to be separated from the first stiffener by a channel. For example, the second stiffener is second stiffener 604, as shown in FIGS. 6-8. As shown in FIG. 9, second stiffener 604 is attached to the top surface of substrate 104, and is co-planar with first stiffener 602. First stiffener 602 and second stiffener 604 are separated by channel 606.

In step 1406, an IC die is mounted to a surface of the second stiffener. For example, the IC die is IC die 102, which is shown mounted to top surface 908 of second stiffener 604 in FIG. 9.

Note that in embodiments, as described above, steps 1402 and 1404 may occur during a single manufacturing process step, or in separate manufacturing process steps. Furthermore, first and second stiffeners 602 and 604 may be formed from a single stiffener piece, where the stiffener piece is separated or split into first stiffener 602 and second stiffener 604. While splitting the stiffener piece, channel 606 may be formed between first stiffener 602 and second stiffener 604. Alternatively, first and second stiffeners 602 and 604 may each be formed separately.

Steps 1408 through 1418 of flowchart 1400 are additional optional steps, according to further embodiments of the present invention. Any number of one or more of the steps 1408 through 1418 may be performed in further embodiments of the present invention.

In step 1408, a bond pad of the IC die is coupled to a contact pad on the first surface of the substrate with a wire bond that passes through the channel. For example, the wire bond is wire bond 108 shown in FIG. 9, which passes through channel 606. In an embodiment, the channel has a first width in a first portion of the channel, the channel has a second width in a second portion of the channel, and the bond pad of the IC die is coupled to the contact pad on the first surface of the substrate through the second portion with the wire bond. For example, as shown in FIG. 6, channel 606 has a first portion 612 and a second portion 610. Second portion 610 has a width greater than that of first portion 612. Note that a wire bond may be coupled through channel 606, through either or both of first and second portions 612 and 610.

In step 1410, a bond pad of the IC die is coupled to a surface of the first stiffener with a wire bond. For example, the wire bond is wire bond 902, shown in FIG. 9, which is coupled to top surface 914 of first stiffener 602.

In step 1412, a bond pad of the IC die is coupled to the surface of the second stiffener with a wire bond. For example, the wire bond is wire bond 904, shown in FIG. 9, which is coupled to top surface 908 of second stiffener 604.

In step 1414, a bond pad of the IC die is coupled to a contact pad on the first surface of the substrate through an opening through the first stiffener with a wire bond. For example, the opening may be opening 114, which is shown in second stiffener 604 in FIGS. 6, 7, and 9 for illustrative purposes. One or more openings 114 may be present in first stiffener 602, through which one or more wire bonds may be coupled.

In step 1416, a bond pad of the IC die is coupled to a contact pad on the first surface of the substrate through an opening through the second stiffener with a wire bond. For example, the opening is opening 114 as shown in second stiffener 604 in FIGS. 6, 7, and 9. As shown in FIG. 9, wire bond 108 is coupled through opening 114.

In step 1418, a bond pad of the IC die is coupled to a contact pad on the first surface of the substrate with a wire bond that passes through an opening through the second stiffener that has an edge that is open to the channel. For example, as shown in FIGS. 6-8, one or more openings 608 may be present in first and/or second stiffeners 602 and 604 that have an edge open to channel 606. One or more wire bonds may be coupled through each opening 608.

FIG. 14B shows additional optional steps for flowchart 1400, according to further embodiments of the present invention. Any one or more of the steps shown in FIG. 14B may be performed in embodiments, alone or in combination with one or more steps shown in FIG. 14A.

In step 1420, the IC die is encapsulated. For example, as shown in FIG. 9, and further described above, IC die 102 may be encapsulated by an encapsulate 116.

In step 1422, a plurality of solder balls are attached to a plurality of solder ball pads on a second surface of the substrate. For example, as shown in FIG. 9, the plurality of solder balls may be solder balls 106, which are coupled to solder ball pads 906 on the bottom surface of substrate 104.

Figure 15:
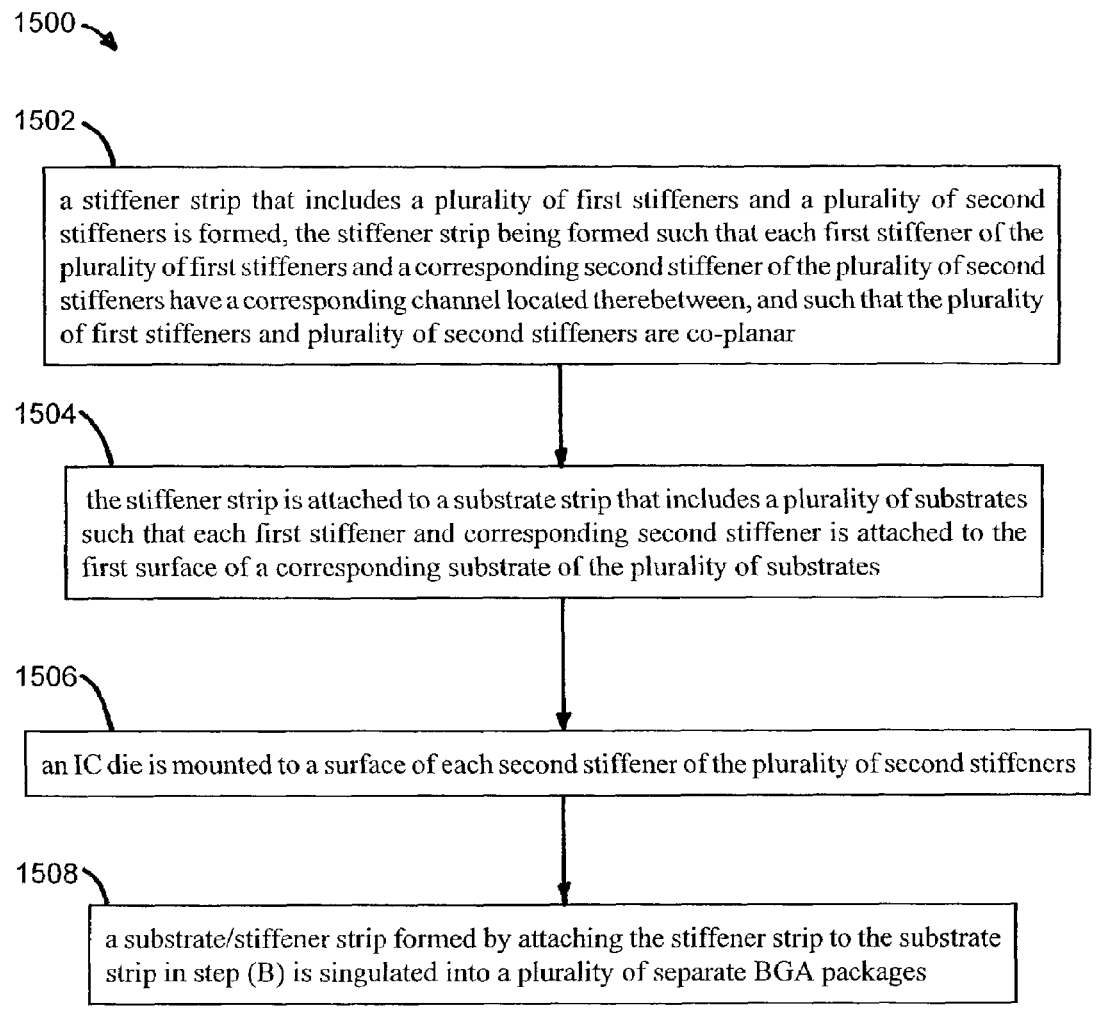
FIG. 15 shows a flowchart providing example steps for assembling a plurality of BGA packages, according to embodiments of the present invention.

FIG. 15 shows a flowchart 1500 providing steps for assembling a plurality of BGA packages according to one or more embodiments of the present invention. Other operational and structural embodiments will be apparent to persons skilled in the relevant art(s) based on the following discussion. These steps are described in detail below.

Flowchart 1500 begins with step 1502. In step 1502, a stiffener strip that includes a plurality of first stiffeners and a plurality of second stiffeners is formed, the stiffener strip being formed such that each first stiffener of the plurality of first stiffeners and a corresponding second stiffener of the plurality of second stiffeners have a corresponding channel located therebetween, and such that the plurality of first stiffeners and plurality of second stiffeners are co-planar. For example, the stiffener strip is stiffener strip 1000, as shown in FIG. 10. Stiffener strip 1000 includes first stiffeners 602*a-f* and second stiffeners 604*a-f*. Each pair of first and second stiffeners has a corresponding one of channels 606*a-f* located therebetween.

In step 1504, the stiffener strip is attached to a substrate strip that includes a plurality of substrates such that each first stiffener and corresponding second stiffener is attached to the first surface of a corresponding substrate of the plurality of substrates. For example, the substrate strip is substrate strip 1100, which includes a plurality of substrates 104*a-f*, as shown in FIG. 11. As shown in FIG. 12, stiffener strip 1000 is attached to substrate strip 1100 to form combined panel 1200. Each pair of first and second stiffeners 602 and 604 is attached to a corresponding substrate 104, to form a stiffener/substrate combination 1202.

In step 1506, an IC die is mounted to a surface of each second stiffener of the plurality of second stiffeners. For example, as shown in FIG. 9 for a single BGA package, an IC die 102 may be attached to top surface 908 of each of second stiffeners 604*a-f*.

In step 1508, a substrate/stiffener strip formed by attaching the stiffener strip to the substrate strip in step (B) is singulated into a plurality of separate BGA packages. For example, as described above, FIG. 13 shows a portion of a singulation process for stiffener/substrate combinations 1202 in combined panel 1200.

Step 1508 may include the step of physically separating each first stiffener from the corresponding second stiffener. As described above, the singulation process may physically separate each first stiffener 602 from the corresponding second stiffener 606 in the combined panel 1200 by removing material while making the singulation cuts, such as while making first and second vertical cuts 1302 and 1304 shown in FIG. 13.

Note that the steps shown in FIGS. 14A and 14B for single BGA packages are applicable to assembling multiple BGA packages, as shown in FIG. 15. Further steps for the processes of flowcharts 1400 and 1500 shown in FIGS. 14A, 14B, and 15 will be known to persons skilled in the relevant art(s) from the teachings herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
 a substantially planar substrate that has a plurality of contact pads on a first surface of said substrate that are electrically connected through said substrate to a plurality of solder ball pads on a second surface of said substrate;
 a substantially planar first stiffener attached to said first surface of said substrate;
 a substantially planar second stiffener attached to said first surface of said substrate to be co-planar with said first stiffener, said second stiffener being separated from said first stiffener by a channel therebetween; and
 an integrated circuit (IC) die mounted to a surface of said second stiffener.

2. The package of claim 1, wherein said first stiffener, said second stiffener, and said channel form a substantially rectangular shape.

3. The package of claim 2, wherein a single stiffener piece is split to form the first stiffener, the second stiffener, and the channel.

4. The package of claim 1, further comprising:
 a plurality of solder balls attached to said plurality of solder ball pads.

5. The package of claim 1, further comprising:
 a wire bond that couples a bond pad of said IC die to a surface of said first stiffener.

6. The package of claim 5, further comprising:
 a second wire bond that couples a second bond pad of said IC die to the surface of said second stiffener.

7. The package of claim 1, further comprising:
 a wire bond that couples a bond pad of said IC die to the surface of said second stiffener.

8. The package of claim 1, wherein said first stiffener has an opening that is open at a first surface and a second surface of said first stiffener.

9. The package of claim 8, further comprising:
 a wire bond that couples a bond pad of said IC die to a contact pad on said first surface of said substrate through said opening.

10. The package of claim 1, wherein said second stiffener has an opening that is open at a first surface and a second surface of said second stiffener.

11. The package of claim 10, further comprising:
 a wire bond that couples a bond pad of said IC die to a contact pad on said first surface of said substrate through said opening.

12. The package of claim 1, wherein said channel has a first width in a first portion of said channel, and said channel has a second width in a second portion of said channel.

13. The package of claim 12, wherein said second width allows for at least one wire bond to be coupled between a bond pad of said IC die and a contact pad on said first surface of said substrate through said second portion of said channel.

14. The package of claim 1, wherein said second stiffener has an opening that is open at a first surface and a second surface of said second stiffener and wherein said opening has an edge that is proximate to said channel.

15. The package of claim 14, further comprising:
 a wire bond that couples a bond pad of said IC die to a contact pad on said first surface of said substrate through said opening.

16. The package of claim 1, wherein at least one of said first stiffener and said second stiffener includes at least one metal.

17. The package of claim 16, wherein said at least one metal includes copper.

18. The package of claim 16, wherein said at least one metal includes aluminum.

19. The package of claim 16, wherein said at least one metal is an alloy.

20. The package of claim 1, wherein at least one of said first stiffener and said second stiffener includes a ceramic.

21. The package of claim 1, wherein at least one of said first stiffener and said second stiffener includes an organic material.

22. The package of claim 1, wherein at least one of said first stiffener and said second stiffener includes a plastic.

* * * * *